(12) United States Patent
Palm et al.

(10) Patent No.: US 9,107,324 B2
(45) Date of Patent: Aug. 11, 2015

(54) CIRCUIT MODULE AND METHOD OF MANUFACTURING THE SAME

(71) Applicants: Petteri Palm, Helsinki (FI); Risto Tuominen, Helsinki (FI); Antti Iihola, Helsinki (FI)

(72) Inventors: Petteri Palm, Helsinki (FI); Risto Tuominen, Helsinki (FI); Antti Iihola, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 0 days.

(21) Appl. No.: 14/231,758

(22) Filed: Apr. 1, 2014

(65) Prior Publication Data

US 2014/0210090 A1    Jul. 31, 2014

Related U.S. Application Data

(63) Continuation of application No. 12/990,785, filed as application No. PCT/FI2009/050383 on May 11, 2009, now Pat. No. 8,699,233.

(30) Foreign Application Priority Data

May 12, 2008    (FI) ..................................... 20085443

(51) Int. Cl.
*H05K 1/18*    (2006.01)
*H01L 23/538*    (2006.01)
(Continued)

(52) U.S. Cl.
CPC .......... *H05K 1/188* (2013.01); *H01L 23/49866* (2013.01); *H01L 23/5384* (2013.01); *H01L 23/5389* (2013.01); *H01L 24/19* (2013.01); *H01L 24/24* (2013.01); *H01L 24/82* (2013.01); *H01L 21/486* (2013.01); *H01L 2221/68359* (2013.01); *H01L 2224/0401* (2013.01); *H01L 2224/04105* (2013.01); *H01L 2224/12105* (2013.01); *H01L 2224/13144* (2013.01); *H01L 2224/13147* (2013.01); *H01L 2224/24137* (2013.01); *H01L 2224/24227* (2013.01); *H01L 2224/92144* (2013.01); *H01L 2924/0102* (2013.01); *H01L 2924/0103* (2013.01); *H01L 2924/01005* (2013.01); *H01L 2924/01006* (2013.01); *H01L 2924/01013* (2013.01); *H01L 2924/01023* (2013.01);
(Continued)

(58) Field of Classification Search
CPC ......... H05K 1/188; H01L 24/19; H01L 24/24
See application file for complete search history.

(56) References Cited

U.S. PATENT DOCUMENTS

| 6,396,148 | B1 * | 5/2002 | Eichelberger et al. | 257/758 |
| 2004/0246690 | A1 * | 12/2004 | Nakamura et al. | 361/763 |
| 2006/0056152 | A1 * | 3/2006 | Li et al. | 361/697 |

*Primary Examiner* — Jeremy C Norris
(74) *Attorney, Agent, or Firm* — Seppo Laine Oy

(57) ABSTRACT

Manufacturing method and circuit module, which comprises an insulator layer and, inside the insulator layer, at least one component, which comprises contact areas, the material of which contains a first metal. On the surface of the insulator layer are conductors, which comprise at least a first layer and a second layer, in such a way that at least the second layer contains a second metal. The circuit module comprises contact elements between the contact areas and the conductors for forming electrical contacts. The contact elements, for their part, comprise, on the surface of the material of the contact area, an intermediate layer, which contains a third metal, in such a way that the first, second, and third metals are different metals and the contact surface area ($A_{CONT\ 1}$), between the intermediate layer and the contact area is less that the surface area ($A_{PAD}$) of the contact area.

20 Claims, 15 Drawing Sheets

(51) Int. Cl.
*H01L 23/00* (2006.01)
*H01L 23/498* (2006.01)
*H01L 21/48* (2006.01)
*H05K 3/30* (2006.01)

(52) U.S. Cl.
CPC ............... *H01L 2924/01024* (2013.01); *H01L 2924/01027* (2013.01); *H01L 2924/01029* (2013.01); *H01L 2924/01033* (2013.01); *H01L 2924/01047* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/12041* (2013.01); *H01L 2924/14* (2013.01); *H01L 2924/1433* (2013.01); *H01L 2924/1461* (2013.01); *H01L 2924/1517* (2013.01); *H01L 2924/15153* (2013.01); *H05K 3/305* (2013.01); *H05K 2201/0355* (2013.01); *H05K 2201/0969* (2013.01); *H05K 2201/09509* (2013.01); *H05K 2201/10674* (2013.01); *H05K 2203/063* (2013.01); *Y10T 29/4913* (2015.01); *Y10T 29/49117* (2015.01)

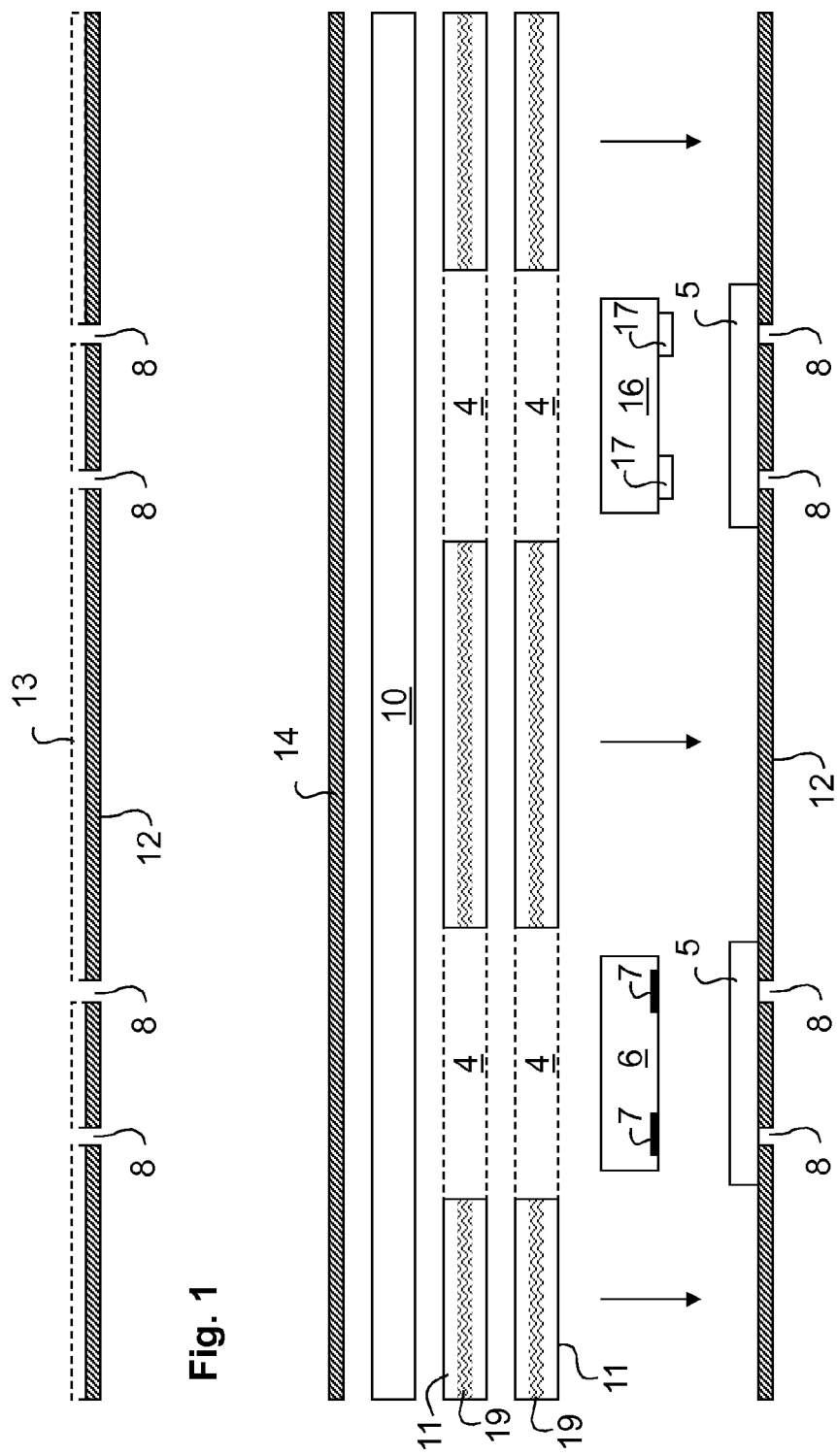

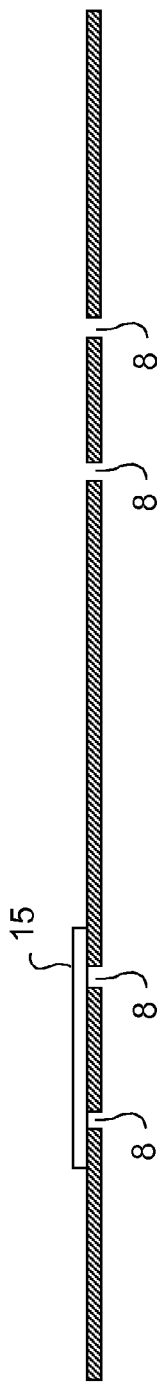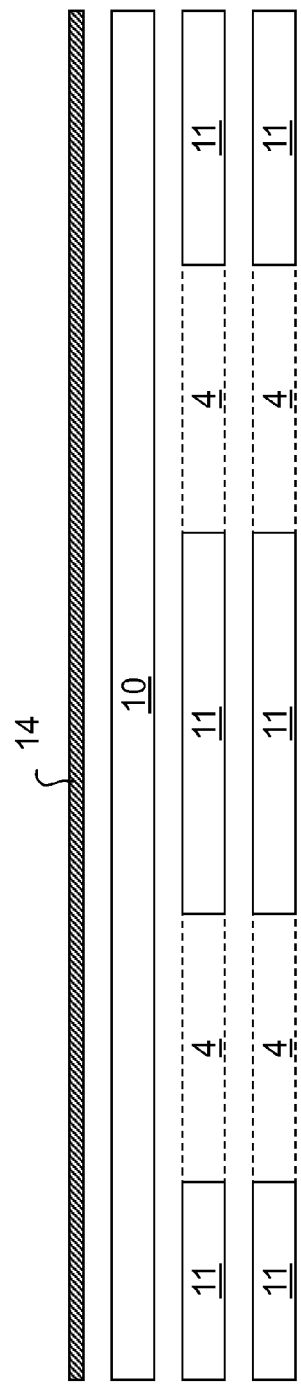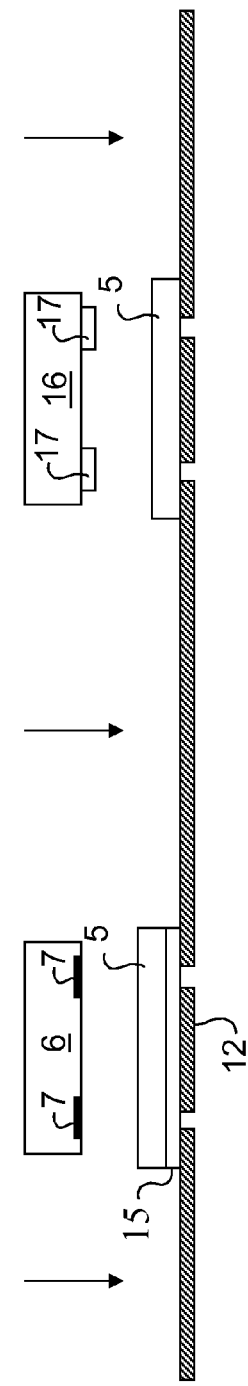

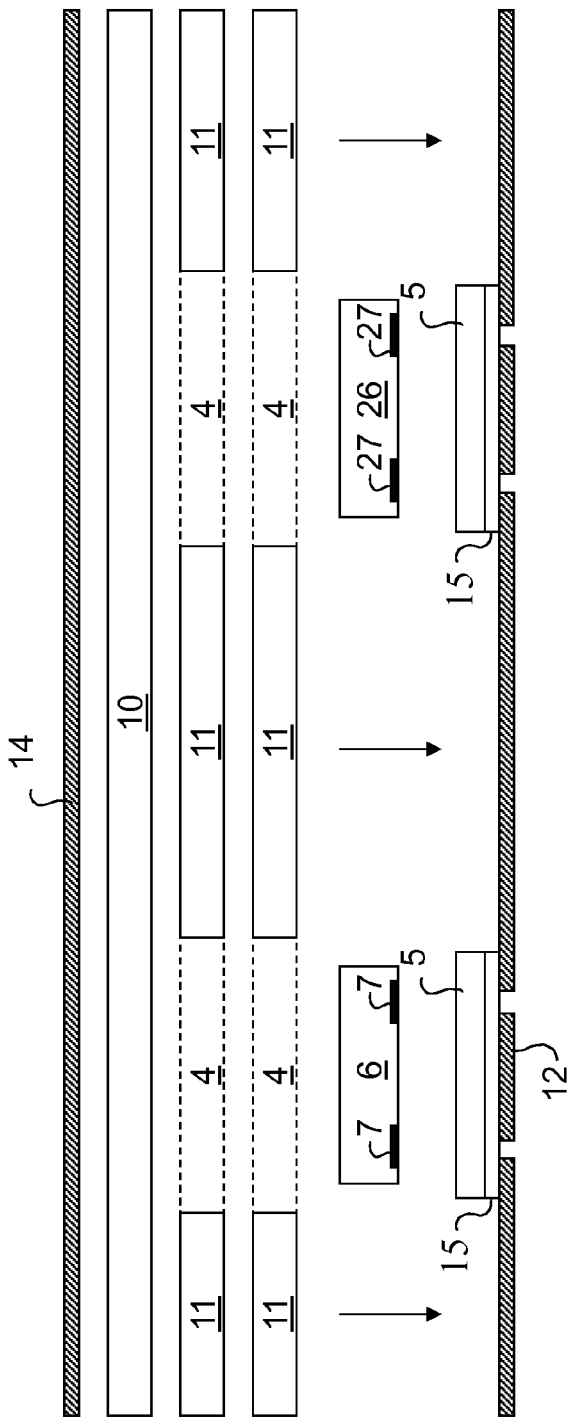
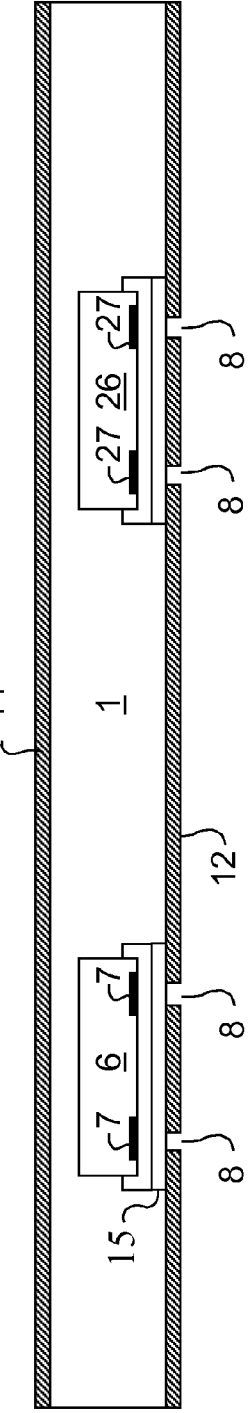
Fig. 18
Fig. 19

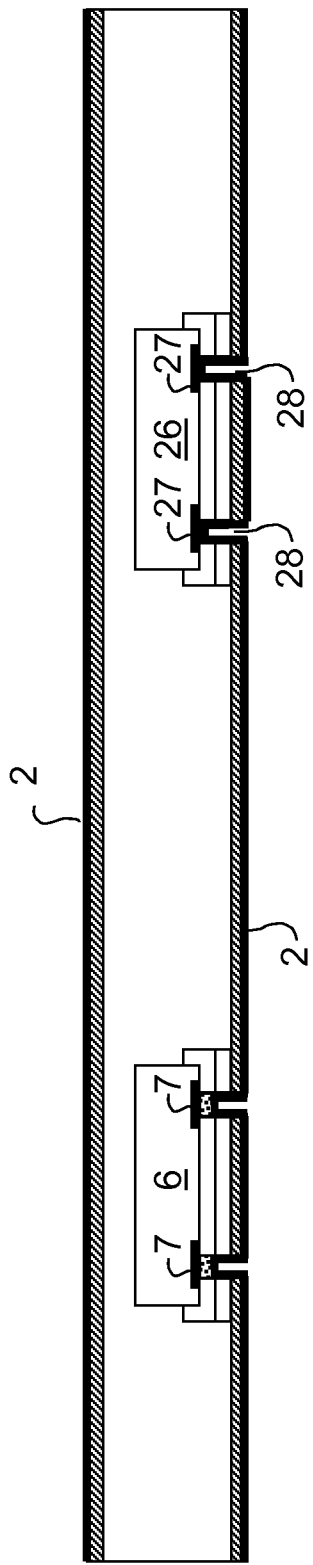
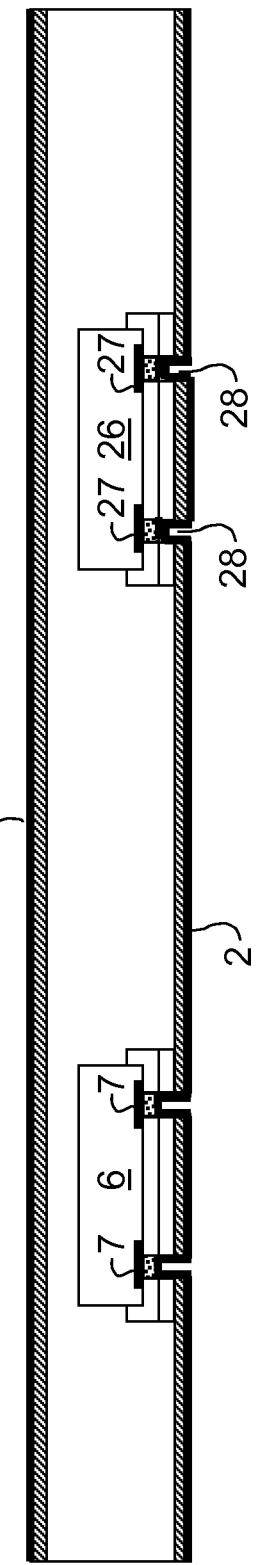
Fig. 23
Fig. 24

CIRCUIT MODULE AND METHOD OF MANUFACTURING THE SAME

TECHNICAL FIELD

The present invention relates to circuit modules, which comprise an insulator layer and, inside the insulator layer, at least one component, which comprises contact areas. In addition, the circuit modules comprise conductors on the surface of the insulator layer, through which a component can be connected to become part of a circuit outside the component. For creating electrical contacts, the circuit modules comprise contact elements between the contact areas of the component and the conductors.

The invention also relates to methods for manufacturing the aforementioned circuit modules.

BACKGROUND ART

In the background art, several different ways are described, by means of which circuit modules containing components located inside an insulator material can be manufactured. The background art also discloses several solutions for manufacturing electrical contacts to the contact terminals of a component, by means of contact elements, and methods for manufacturing a conductor-pattern layer connected to the contact elements.

When evaluating circuit modules and manufacturing methods, attention can be paid, for example, to the circuit module's properties achieved by the method, for example, its price, mechanical durability, and the thickness (thinness) that can be achieved. Depending on the applications, significant factors can also be the quality and durability of the electrical contacts and the reliability and quality of the electrical properties of the whole module. Significant properties to be examined in terms of manufacturing can also be, for example, the reliability, yield, efficiency, price, and environmental friendliness of the manufacturing methods to be used. The practicability of the manufacturing method is also affected by the availability of raw materials and the ability of the method to place different types of component in a circuit module.

All in all, the requirements set for manufacturing methods and circuit modules are thus very diverse and vary according to the application. This being the case, there is still a need in the sector to develop new circuit-module structures and manufacturing methods, which can offer new or improved properties, or combinations of properties.

One line of development has been the placing of components inside the electronics module in a bumpless form, i.e. without growing bumps of top of the contact areas of the component. Cost benefits can then be gained, as the components need no longer be transported during manufacture to a separate production plant to make the bumps.

The applicant's own patent and application publications disclose manufacturing techniques, which can also be used in connection with bump-free components. The techniques described are particularly suitable for components, in which the material of the contact areas is copper. Of the applicant's own publications, those that can be referred to as most closely relating to the invention are the international patent application publications WO 2004/089048, WO 2005/027602, WO 2005/125298, WO 2006/013230, WO 2006/056643, WO 2006/134216, WO 2006/134217, and WO 2007/107630.

However, at present copper is quite little used as a conductor material in semiconductor processes. The most common conductor material is aluminium. In circuit-board manufacture, on the other hand, copper is the principal material for conductors. Copper conductors of a circuit module can be grown directly on top of aluminium contact areas, but the contact between copper and aluminium is brittle, so that a module of this kind is not optimal in applications, in which mechanical stress acts on the circuit module.

An improved possibility to use contact areas of aluminium or contact areas containing aluminium would mean that, in circuit modules and manufacturing methods, normal semiconductor circuits in a bumpless form could be used immediately after the semiconductor manufacturing processes and the passivation of the surface. As aluminium is the conductor material most widely used in the semiconductor industry, good compatibility between the contact element of the circuit module and aluminium would also ensure that suitable semiconductor circuits would be abundantly and economically available. Attempts to develop such manufacturing methods have indeed already been made for several decades in the field of component packaging technology. In component packaging solutions of this kind, the goal has been a technique, by means of which a relatively small component package could be manufactured around a component, to which a circuit board could then be attached later. Unlike packaging technology, the goal of the manufacturing techniques of the circuit module to which the present invention relates is the ability to manufacture the entire circuit board in the same process, so as to completely eliminate the packaging stage of the separate component. Of course, this does not exclude the possibility of using the manufacturing method of the circuit module to manufacture only a component package.

The U.S. Pat. No. 4,246,595, Noyori et al., discloses a method, in which the contact areas of a component are brought into contact with an insulator sheet, in which V-shaped openings have been made. First of all, a layer of titanium (Ti) or chromium (Cr) is grown on the surfaces of the openings and the aluminium contact areas. This intermediate metal layer is intended to prevent the copper from diffusing into the aluminium and the semiconductor component, as well as to improve the adhesion between the copper and the aluminium. In addition, the intermediate layer acts as an electrical conductor later during electrochemical growing (electroplating), so that the intermediate metal layer will reliably cover also the side walls of the openings. The growing of the titanium or chromium layer requires the use of the sputtering technique, for which reason the openings must also have a clear V shape. Sputtering is expensive when used on large surfaces (on circuit modules) while additionally the open V shape reduces the available conducting density. Contract structures of a corresponding type are also disclosed in U.S. Pat. No. 4,783,695 and U.S. Pat. No. 4,894,115, Eichelberger et al., and in U.S. Pat. No. 5,353,195, Fillion et al.

Later, in U.S. Pat. No. 6,396,148, Eichelberger at al., an attempt is made to solve the problems relating to sputtering, by forming the intermediate metal layer by growing a layer of nickel on the surface of the aluminium contact areas. According to the patent, the growing of the nickel is performed by means of a chemical growing method (electroless plating). Yet another layer, which also covers the side walls of the openings made in the insulating material for the contacts, is growing on top of the nickel layer by means of a chemical growing method. In the method, the components are attached first by their side and rear surfaces to the insulator layer and, after this, a photo-patternable polymer is spread on the front surface of the component and on top of the contact areas. The polymer is patterned by exposing it to light and developing it, to form openings for the contacts.

One possibility is to grow bumps on the surface of the conductors of the circuit-board part of the circuit module and attach the component to the conductors by a flip-chip mounting technique, for example, by ultrasound bonding. Such a method is disclosed in the applicant's own international patent application WO 2006/134220. Problems relating to both production and the quality of the contacts are associated with methods using flip-chip methods.

DISCLOSURE OF INVENTION

The object of the invention is to develop a new contact-element structure envisaging the utilization of bumpless components, as well as a circuit module and manufacturing technique using such a structure.

According to an aspect of the invention, a bumpless component is used in the circuit module, the material of the contact areas of which being of a different metal, or metal alloy to the conductors of the conductor layer of the circuit module. The contact areas of the component and the conductors of the circuit module are connected to each other with the aid of contact elements, which contain an intermediate layer, which contains a third metal or metal alloy, which differs from the material of the contact areas and conductors, on the surface of the material of the contact area. In addition, the contact surface area between the intermediate layer of each contact element and the contact area of the component is smaller that the surface area of the contact area.

According to another aspect of the invention, a manufacturing method is created in order to manufacture the circuit module described above, in which the component is attached to a conductor foil or conductor-pattern layer with the aid of a polymer layer and contact elements are made through the polymer layer. When making the contact elements, contact holes are made in the polymer layer on top of the contact areas, at the locations of the contact areas. The contact holes are dimensioned in such a way that the contact surface area between each contact hole and the corresponding contact area is smaller than the total surface area of the contact area. After this, the contact holes are filled with a conductor material, in such a way that filling is started by coating the surface of the contact areas with an intermediate layer, for example, by using one or more chemical metal-growing methods.

Thus, a new type of circuit module and manufacturing method is obtained, which can offer some advantages in terms of the applications of some circuit modules.

In addition, the invention has numerous special embodiments, which provide additional advantages.

In one embodiment, components are used in the circuit module, the material of the contact areas of which contains aluminium and the contact elements comprise a layer containing zinc on the surface of these contact areas containing aluminium. In addition, the contact elements are manufactured in such a way that the contact surface area between the layer containing zinc and the contact area is smaller than the total surface area of the actual contact area.

A layer containing zinc has been observed to be useful in terms of the quality of the electrical contact, as coating a layer containing zinc on the surface of an aluminium contact area prevents the re-oxidation of the aluminium surface and permits the creation of good adhesion between the aluminium and the next layer. In addition, the layer containing zinc improves the mechanical durability against lateral stress of the contact formed through the interface between the aluminium and the intermediate layer of other metal.

We have observed that extremely good mechanical durability is achieved by using a double zincate process, in which the blank containing the components is subjected to the zincate process at least twice. Thus a more even and denser layer of zinc is made to grow on top of the aluminium contact surfaces. After a single zincate treatment, there is zinc on only some areas of the contact surfaces, or else the layer is porous, therefore a double zincate process is used in the preferred embodiment.

The possibility to use contact elements that are narrower than the contact area can, for its part, provide advantages, for example, by allowing the conductors connected to the contact elements to also be made narrow, especially in embodiments, in which the contact element is essentially of even width vertically, or only narrows moderately towards the component.

In an embodiment of the manufacturing process, in which contact openings are made in the conductor foil of the conductor-pattern layer prior to attaching the component, the component can be attached aligned relative to the contact openings while, in addition, the contact holes needed for the manufacture of the contact elements can be made through these contact openings, by using the material of the conductor foil or conductor-pattern layer as a mask. In such an embodiment, an advantage is obtained in the case of the alignment between the contact elements and the contact areas. In addition, an advantage is obtained in terms of the manufacture of the contact holes, because the holes can be opened using a $CO_2$ laser, for example.

In an embodiment, in which the contact holes are opened using a laser, the contact holes can be opened one component or component-group at a time, and thus the first intermediate layer can be manufactured first through the contact holes, on top of the contact areas of the first components, and then later the second intermediate layer can be manufactured through the contact holes opened later, on top of the contact areas of the second components. Thus, components, the materials of the contact areas of which differ from each other and are incompatible with the growth processes of the same intermediate layer, can be fitted in the same process.

In the embodiments, it is also possible to attach the components to the conductors by means of mutually differing polymer layers. Thus the properties of the insulation between the component and the conductor can be arranged to also be suitable for different mechanical and electrical requirements.

BRIEF DESCRIPTION OF DRAWINGS

FIGS. 1-8 show the intermediate stages of a circuit module when using a manufacturing method according to one embodiment.

FIGS. 10-17 show the intermediate stages of a circuit module when using a manufacturing method according to a second embodiment.

FIGS. 18-23 show the intermediate stages of a circuit module when using a manufacturing method according to a third embodiment.

FIG. 24 shows one intermediate stage of a circuit module when using a manufacturing method according to a fourth embodiment.

MODES FOR CARRYING OUT THE INVENTION

Figure 3:
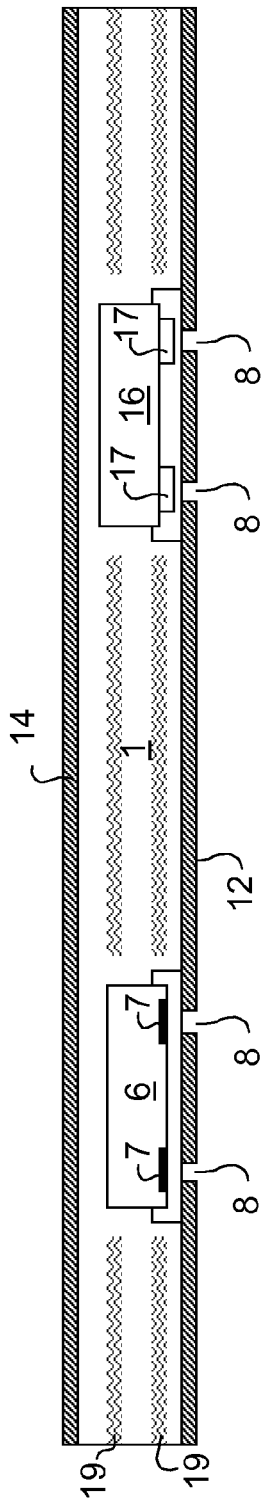

FIGS. 1-9 show one exemplary application of the manufacturing method according to one embodiment. In this embodiment, manufacture begins from a conductor foil 12, which of metal, for example. A suitable conductor foil 12 is, for example, a copper film, the thickness of which is in the range 1-70 µm, typically in the range 3-12 µm. Instead of a bare conductor foil 12, it is also possible to use as the base material a layered sheet, which comprises a conductor foil 12 and an insulator layer 13, which is shown by a broken line in FIG. 1, on the surface of this. In the embodiments described in the following, it is possible to use such a layered sheet 12, 13, in place of the conductor foil 12.

Differing from what is shown in FIG. 1, it is also possible to use a layered sheet, which comprises a support membrane on the second surface of the conductor foil 12. The support membrane is on the opposite surface of the conductor foil relative to the components to be attached to the conductor foil. If the layered sheet also comprises an insulator layer 13, the support membrane will then be on the opposite side of the conductor foil to the insulator membrane 13. The support membrane can be used, for example, to improve the mechanical stiffness and ease of handling at the start of the manufacturing process of the conductor foil 12, or the layered sheet 12, 13. The support membrane is, however, intended to be removed at a later stage in the process. It is also possible to proceed by starting manufacture from a support membrane while a conductor foil 12, which is patterned or unpatterned, is made on the surface of this. The process examples and stages described in the application example can also be performed correspondingly when using a support membrane, though this is not stated separately. In the description hereinafter, however, reference will be made to a support membrane only when calling attention to something particularly noteworthy in the case of an embodiment using a support membrane. The actual support membrane can be, for example, of an electrically conductive material, such as aluminium (Al), steel, or copper, or an insulating material, such as a polymer. The thickness of the support membrane can be, for example, 25-400 µm. The thickness of the support membrane is typically in the range 35-105 µm.

Next, contact openings 8 are made in the conductor foil 12, which are located on the conductor foil 12 in such a way that they are placed at the positions of the contact terminals of the components being placed in the module being manufactured. Thus, an individual contact opening 8 is made in the conductor foil 12 for each contact terminal of the component. In this embodiment, the contact openings 8 can be manufactured with the aid of a UV laser. The contact openings 8 can also be manufactured, for example, mechanically by drilling, milling, or etching. In an embodiment using a support membrane, the contact openings 8 are preferably made from the direction of the opposite surface, in such a way that they penetrate the conductor foil 12 completely. However, the contact openings need not penetrate the sheet, instead the method can equally well also be designed in such a way that the contact openings 8 only extend as far as the surface of the material of the support membrane, or form recesses in the material of the support membrane, without, however, passing entirely through it. Also, the contact openings need not pass entirely through the conductor foil, if a thick conductor foil is used, which is thinned by etching in a later stage.

In the embodiment of FIG. 1, the contact openings 8 are manufactured in such a way that the size of a contact opening 8 is less than the contact surface area of the contact material to be placed at the opening 8. The contact opening is typically circular in shape, though other shapes too can be used. The shape and size of the contact opening 8 are selected in such a way that the contact surface of the contact terminal can cover the contact opening 8 entirely.

According to FIG. 2, manufacture is continued by spreading adhesive layers 5 on the surface of the conductor foil 12, in the connection areas of the components. The adhesive layers will then also cover the contact openings 8. Alternatively, the adhesive 5 can be spread on the surface of the components. The adhesive can also be spread on the surface of both the component and the conductor foil 12. Typically, the adhesive is spread locally, so that the adhesive layers 5 will be located only in the connection areas of the components.

The term adhesive refers to a material, by means of which the components can be attached to the conductor foil 12 or insulator layer 13 that acts as a base. One property of the adhesive is that the adhesive can be spread on the surface to be glued in a relatively fluid form, or one that otherwise conforms to the surface shapes, for example, in the form of a film. A second property of the adhesive is that, after spreading, the adhesive hardens, or can be hardened, at least partly, in such a way that the adhesive is able to hold the component in place (relative to the conductor foil 12) at least until the component is secured to the construction in some other way. A third property of the adhesive is an adhesive capability, i.e. an ability to stick to the surfaces being glued.

The term gluing, for its part, refers to the attachment of pieces to be glued to each other with the aid of an adhesive. In the embodiments, the adhesive is brought between the component and the conductor foil 12 or insulator layer 13 acting as a base and the component is placed in a suitable position relative to the base, in which the adhesive is in contact with the component and the base and at least partly fills the space between the component and the base. After this, the adhesive is allowed (at least partly) to harden, or the adhesive is (at least partly) actively hardened, so that the component attaches to its base with the aid of the adhesive. In some embodiments, the contact protrusions of the component may protrude during gluing through the adhesive layer to come into contact with the base.

The adhesive used in the embodiments is typically an epoxy-based adhesive, for example a heat-cured epoxy adhesive. The adhesive is selected in such a way that the adhesive to be used will have sufficient adhesion to the base and the component. One preferred property of the adhesive is a suitable coefficient of thermal expansion, so that the thermal expansion of the adhesive will not differ too much from the thermal expansion of the surrounding material during the process. It would also be preferable for the adhesive selected to have a short hardening time, preferably of a few seconds at most. Within this time, it would be good for adhesive to harden at least partly, so that the adhesive can hold the component in place. Final hardening can take a clearly longer time and can even be planned to take place in connection with later process stages. In addition, the stresses caused by the later process stages, such as thermal, chemical, or mechanical stress, are taken into account when selecting the adhesive. The electrical conductivity of the adhesive will be preferably in the order of the electrical conductivity of the insulator materials.

Next, components 6 and 16, which comprise contact terminals 7 and 17, are taken. Both components 6 and 16 are semiconductor components, for example, processors, memory chips, or other microcircuits. The contact terminals of the component 6 are contact areas 7, which are located essentially on the level of the surface of the component. Such contact areas 7 of the component 6 are created at the semiconductor factory during the manufacturing process of the semiconductor component. The contact area 7 typically forms the surface of a conductor pattern on the metal used in the process. The metal used in the manufacturing process of semiconductor components is typically aluminium, though other metals, metal alloys, or other conductor materials can also be used. For example, the use of copper has become common in semiconductor-component manufacturing processes.

The contact terminals of the component 16 are contact bumps 7, which protrude from the level of the surface of the component. Such contact bumps 17 are manufactured in a bump-making process after the manufacture of the semiconductor component 16, typically in a separate factory. The contact bump 17 can contain one or more metals, metal alloys, or other conductor materials. Typically, the outer surface of the contact bump 17, i.e. the contact surface, is made from copper or gold.

The components 6 and 16 are aligned relative to the contact openings 8, in such a way that each contact terminal 7, 17 comes next to the corresponding contact opening 8, and is pressed against the adhesive layer 5. After this, the adhesive is at least partly hardened, so as to prevent, or minimize the relative movement of the components 6, 16 and the conductor foil 12 after alignment. In alignment and gluing, the aim is to position the contact opening 8 to be in the centre of the corresponding contact terminal 7, 17.

After this, insulator sheets 11, in which openings are made for the components 6, 16, as well as a unified insulator sheet 10, which is of unhardened or pre-hardened polymer, are laminated on top of the conductor foil 12. During lamination, the insulator sheets 10, 11 are melted together and form a unified insulator layer 1 around the components 6, 16. In the embodiment of FIG. 2, the insulator sheets 11 are fibre mats impregnated with polymer, or sheets containing pre-hardened polymer and reinforced with a fibre material. The polymer can be, for example, epoxy and the fibre reinforcement can be, for example, glass-fibre mat. A typical example of a suitable insulating-sheet 11 material is an FR4-type glass-fibre reinforced epoxy sheet. Other reinforcement and polymer material combinations can be used, of course. When using several insulator sheets 11, the sheets can also differ mutually.

In FIGS. 2 and 3, the fibre material is shown by wavy shading 19. In the figures hereinafter, the fibre material 19 is not shown, but these structures too include fibre material 19. The fibre material 19 contained in the insulator sheet 11 or the insulator sheets 11 acts as a reinforcement, which provides the electronic module being manufactured with mechanical strength. According to the example of FIG. 2, holes 4 are made in the insulator sheets 11 at the locations of the components 6, 16. The insulator sheets 11 are perforated particularly to make openings for components in the fibre material 19 contained in the insulator sheets 11. Without perforation, the components would press against the fibre-material layers 19 during lamination. The unperforated insulator sheet 10, on the other hand, can be fibre-reinforced or unreinforced, depending on the embodiment.

The insulator sheets 10, 11 are typically selected in such a way that they contain enough fluid polymer for the polymer flowing in the lamination stage to be sufficient to fill the holes 4 made in the insulator sheets 11 for the component 6, 16, around the components. The structure shown in FIG. 3 is then obtained, in which the insulator layer 1 contains a tight polymer layer, which contains one or more reinforcements of a fibre material 19. The polymer layer is bound tightly to the fibre layer 19 while the tight polymer layer also attaches the components 6, 16 to the surfaces, so that a tight, unified, and mechanically strong insulator layer is formed, which contains the components 6, 16, and which is, in addition, reinforced with fibre material 19.

In the example of FIG. 2, a unified insulator sheet 10 is used, though the insulator sheet 10 can also be omitted from the structure. In that case, the insulator sheet 11 or insulator sheets 11 are selected in such a way that they themselves already contain sufficient fluid polymer to fill the holes 4 in the insulator sheets 11 around the components 6, 16. However, it is typically easier to ensure the filling of the holes 4 by using a separate insulator sheet 10.

A conductor foil 14, which is preferably of a material that is similar to, and equally as thick as the conductor foil 12, is also laminated with the insulator sheets 10, 11 into a single structure. Thus, the insulator layer 1 and the components 6, 16 remains between the corresponding conductor foils 12 and 14. FIG. 3 shows this intermediate stage of the module manufacture. In the intermediate stage of FIG. 3, there is adhesive on the contact surface of the contact terminals 7, 17 and typically also in the contact openings 18. In the stage shown in FIG. 4, this adhesive is removed and contact holes 18, which extend to the contact surfaces of the contact terminals 7, 17 are formed at the positions of the contact openings 8.

With reference to FIG. 3, it can be further stated that the structure can also be manufactured in such a way that a unified layer of fibre material 19 runs between the components 6, 16 and the conductor foil 14. Such a construction can be used when the thickness of the components 6, 16 is sufficiently less than the thickness of the insulator layer 1. The structure can be manufactured, for example, in such a way that a unified insulator sheet 10, which contains the fibre material 19 of the layer, can be laminated onto the structure.

Figure 4:
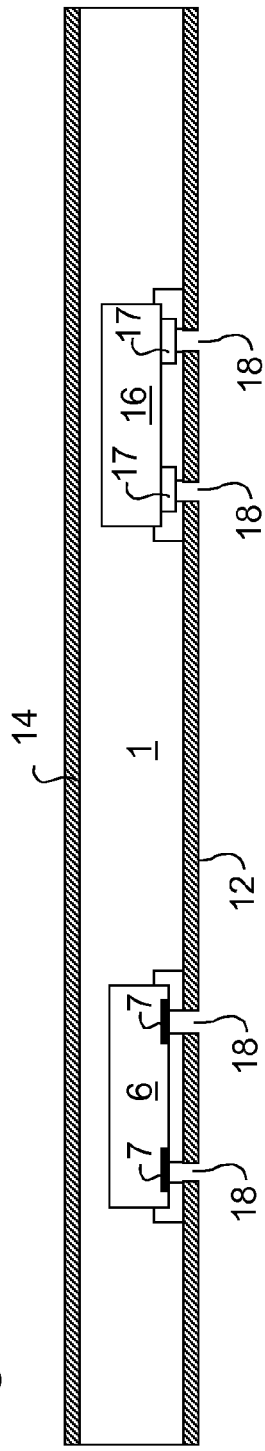

If a support membrane is used in the embodiment on the surface of the conductor foil 12, as depicted in connection with the description of FIG. 1, it is most suitable to remove the support membrane after the lamination, i.e. between the intermediate stages shown in FIGS. 3 and 4.

After lamination and the removal of the possible support layer, the adhesive layer, which has been created in the contact openings 8 and between the contact openings 8 and the contact terminals 7, 17, is removed. In the embodiment of the figures, the removal of the adhesive is implemented by the laser-ablation method, using a $CO_2$ laser. The ability of a $CO_2$ laser to vaporize organic insulating substances, such as epoxy-base adhesive, is good, but its ability to vaporize copper or other metals is poor, to that the conductor foil 12 can be used as mask for making the contact holes 18. Thus, it is possible to manufacture contact holes 18, the diameter of which is less than the diameter of the beam of the $CO_2$ laser. This property creates a significant advantage, as the minimum diameter of the beam of a $CO_2$ laser is typically in the order of 75 µm, which is too large when considering the manufacture of precise electronic module structures. A UV laser, on the other hand, can typically be used to manufacture clearly more precise structures. The minimum diameter of the beam of a UV laser can be, for example 25 µm, but a UV laser is not, on the other hand, suitable for removing adhesive from the contact openings 8 and from between the contact openings 8 and the contact terminals 7, 17.

Thus, the use of a conductor mask permits the manufacture of very precisely limited and precisely positioned contact holes 18 in an insulator material, such as the adhesive 5 using in the embodiment. In addition, the use of a $CO_2$ laser permits the cleaning of the contact surfaces of the contact terminals 7, 17 in the same process stage, without any significant danger of destroying or damaging the contact terminals 7, 17. In the embodiment, the conductor foil 12 is of copper while the contact terminals 7, 17 of the component are also of metal, so that they are not sensitive to the beam of the $CO_2$ laser, so that the process can be designed in such a way that the contact surfaces of the contact terminals 7, 17 will be sure to be cleaned sufficiently well. Thus, the advantage of the method described is that contact openings 8 can be made in the conductor foil 12 very precisely with the aid of a UV laser and, after this, the contact openings can be used as a mask for the making of the contact holes 18 by means of a $CO_2$ laser that is less precise, but safer for the structure.

If the contact holes 8 of the conductor foil 12 were to be manufactured only in this process stage, the method used for machining the metal of the conductor foil 12, for example, a UV laser, would more easily damage also the contact terminals 7, 17, because the energy required to penetrate the conductor foil 12 is significantly greater than the energy required to penetrate the adhesive or other insulation between the contact terminals 7, 17 and the conductor foil 12. In such a manufacturing method, it would be challenging to stop the drilling at precisely the correct depth. In addition, aligning the drilling would be more difficult, due to the deformations arising during lamination and for the reason that the contact terminals 7, 17 of the components cannot be seen through the solid metal film. The use of contact holes 8 pre-manufactured in the conductor foil 12 provides significant advantages, both in the alignment of the components 7, 17 and in the manufacture of the contact holes 18.

Figure 5:
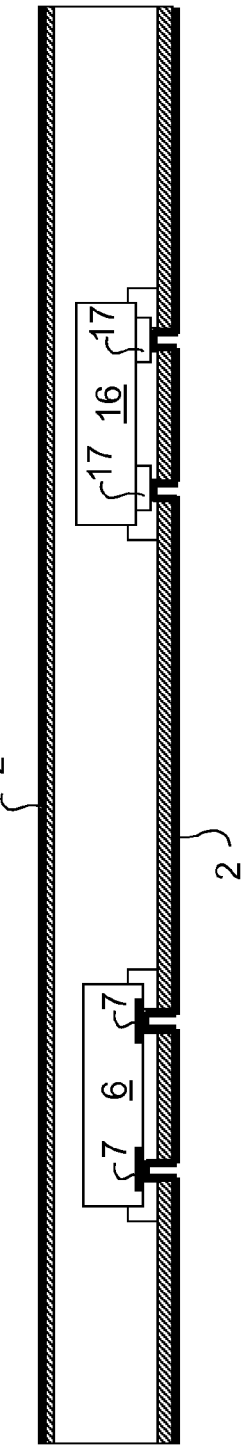

In FIG. 5, an intermediate layer 2, which is of a suitable conductor material, is made in the contact holes 18. The intermediate layer 2 is manufactured using a suitable chemical conductor-material growing method (electroless plating). The intermediate layer 2 can also consist of a layer of two or more different materials, which are manufactured correspondingly using two or more methods. One purpose of the intermediate layer 2 is to form a conductor membrane for the side walls of the contact holes 18, which connects the contact terminals 7, 17 and the conductor foil 12 to each other. A second purpose of the intermediate layer 2 is to provide a material adapter between the material of the of the contact terminals 7, 17 and the conductor-pattern material to be connected to them. Such a material adapter can be required, for example, in order to ensure the quality of the mechanical or electrical contact and durability, for example, when the material of the conductor-pattern layers of the circuit module is copper and the material of the contact terminals 7, 17 is something other than copper (Cu), for example aluminium (Al).

When manufacturing the intermediate layer 2, a suitable chemical growing method is used, because by means of such a method the conductor material can also be grown on the vertical surfaces of the contact holes 18, unlike when using sputtering, for example. An electrochemical method (electroplating) cannot be used in this stage, because the side walls of the contact holes 18 are not conducting. Alternatively, V-shaped-opening contact holes can be used and the intermediate layer 2 made by sputtering. Sputterable materials suitable for this purpose are, for example, titanium-wolfram (TiW) and chromium (Cr). A layer of nickel (Ni) and gold (Au) ca also be grown on top of the TiW or Cr layer. In the example of FIG. 5, nickel frown by a chemical method is used as the intermediate layer 2 in the example of FIG. 5, however, so that the intermediate layer 2 will grow at the same time also on the surfaces of the conductor foils 12 and 14. Another example of the intermediate layer 2 is a layer containing zinc, manufactured on the surface of the contact terminals 7, 17, on top of which a layer of nickel (Ni) can further be manufactured. More alternatives that are possible are depicted in connection with the description of FIGS. 26-33.

Figure 6:
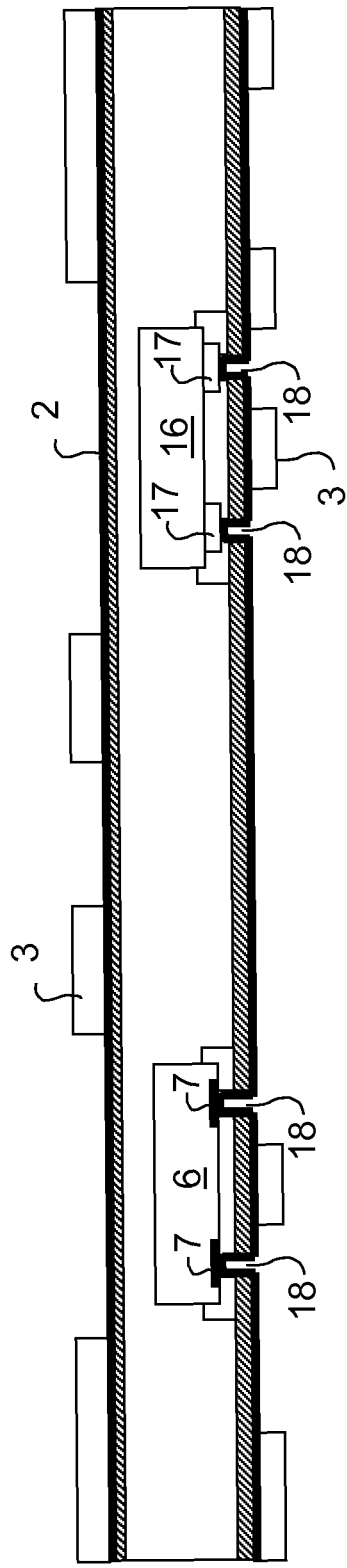
Figure 7:
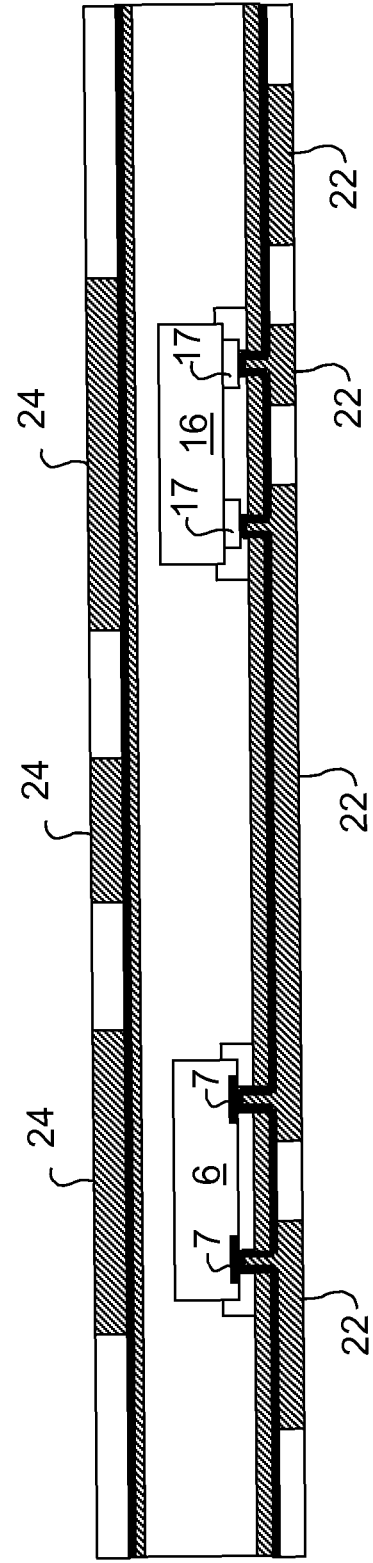

In this embodiment, after the manufacture of the intermediate layer 2, manufacture is continued by spreading resist layers 3, typically photoresist layers, on both surfaces of the module. The resist layers 3 are patterned with the aid of a conductor-pattern mask by exposure and development, in such a way that the resist 3 is removed from the desired parts of the conductor patterns of the conductor-pattern layers. This intermediate stage is shown in FIG. 6. After this, the module is taken to an electrochemical bath and voltage is led to the intermediate layers 2 of the module. The desired conductors of the conductor-pattern layer are then grown in the openings of the resist layers 3. The conductor material also grows in the contact holes 18, forming a conductor core to the contact elements, as can be seen from FIG. 7. In the example of FIG. 7, the conductors 22, 24 are electrochemically grown copper. Finally, thin etching-mask layers are grown on the surface of the conductors 22, 24. A layer of tin (Sn), for example, can act as the etching mask.

Next, the resist layers 3 are removed, when, in the embodiment of the figures, the intermediate layer 2 is revealed from under the removed resist. The revealed part of the intermediate layer 2 is removed, for example, by etching, the same procedure being use for the parts of the conductor foils 12 and 14 revealed outer the conductors 22 and 24. The etching-mask layer then protects the outermost surfaces of the conductors 22 and 24 from the effects of the etching. An electronic module, which contains two components 6 and 16 connected electrically to conductors 22, comprising two conductor-pattern layers (conductors 22 and 24), and shown in FIG. 8, is then obtained.

In the example of FIGS. 6 and 7, the conductors 22 and 24 are grown directly into their correct shape in the openings made in the resist layer 3. However, the conductors 22 and 24 can also be manufactured in another way, both in this example and in the examples described hereinafter. One alternative way of manufacture is to grow a unified layer of conductor material over the surfaces of the entire module blank and to pattern the conductor layer later by means of a lithography method, in order to form the conductors 22 and 24. Described in greater detail, it is possible to proceed, for example, in such a way that, continuing from the intermediate stage of FIG. 5, copper is grown on the surfaces of both intermediate layers 2 by means of an electrochemical method. In that case, the contact holes 18 too are filled with copper. After this, resist layers are spread on top of the copper layers, the resists are patterned, and the excess parts of copper, or the intermediate layer 2 and the conductor foils 12 and 14 are etched. After this, the resist mask is removed. Using either manufacturing method, the result is the structure shown in FIG. 8.

Figure 8:
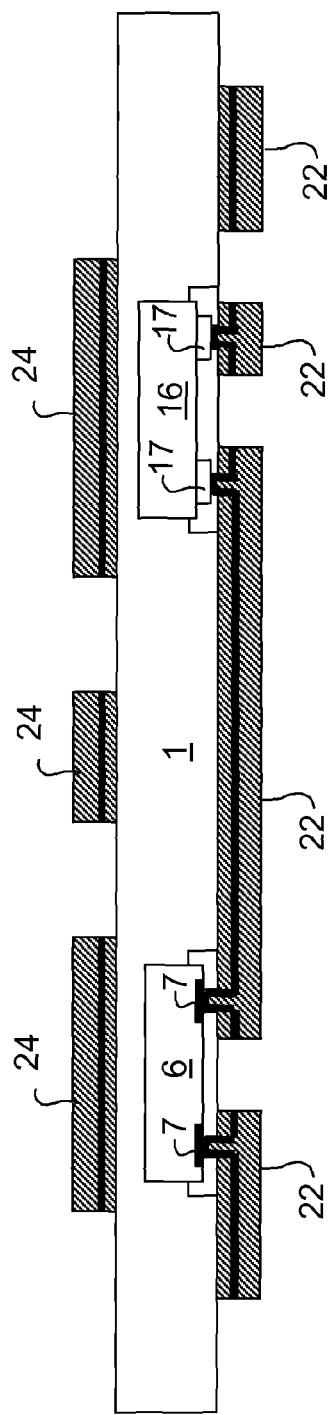

FIG. 8 can show an already finished simple circuit module, but manufacture is usually continued by manufacturing additional insulator and conductor layers on the surfaces of the circuit module, which are connected electrically with the aid of vias to the structure shown in FIG. 8. In addition, it should be noted that vias can be manufactured in the module too of FIG. 8, which connect the conductors 22 to the conductors 24. Such vias can be manufactured in a corresponding manner to, and in the same process stages as described above in the manufacture of the contact elements.

Figure 9:
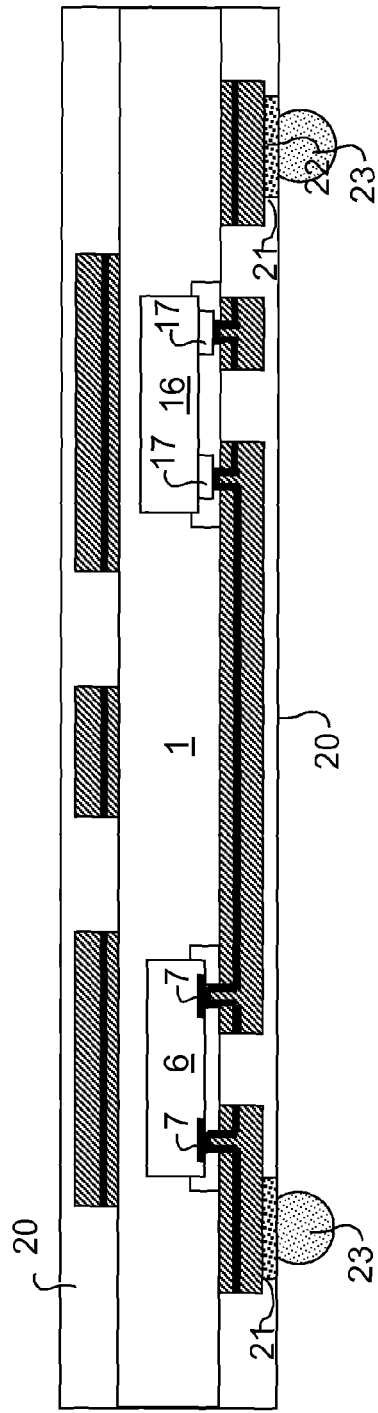
FIG. 9 shows one example of a circuit module according to one embodiment.

The module of FIG. 8 can be further refined in the manner shown in FIG. 9, in such a way that the surfaces of the module are protect by protecting layers 20. In addition, in the example of FIG. 9, external contact elements, which comprise bases 21 made on top of the conductor patterns 22, 24 and contact balls 23 made on their surfaces, are manufactured in the module.

FIGS. 10-16 show a manufacturing method according to a second embodiment, up to a stage corresponding to the intermediate stage shown in FIG. 5. Manufacture can be continued from the intermediate stage of FIG. 16, for example, as shown by FIGS. 6-9, or suitably also in an alternative manner, in which the material of the conductors 22 and 24 is first of all grown over the entire surface and after that patterned to form conductors 22 and 24. The technical features and parameters presented in connection with the description of FIGS. 1-5 can also be applied in the process stages shown in FIGS. 10-16, so that there is no need to repeat all the details of the manufacturing process and their advantages in the following embodiment. On the other hand, the essential differences between the embodiments shown by FIGS. 1-9 and FIGS. 10-16 are brought out in the following.

In the embodiment of FIGS. 10-16, manufacture starts, as in FIG. 1, from a conductor foil 12, in which contact openings 8 are made. After this, a spacer 15 is attached to the future attachment point of the component 6 on the surface of the conductor foil 12. The spacer 15 is of a suitable insulating material, for example, of pre-hardened adhesive or some other polymer, which has sufficient adhesion with the surface of the conductor foil 12. The spacer 15 can also be of hardened polymer, in which case it can be attached to the surface of the conductor foil 12, for example with the aid of separate adhesive.

A spacer 15 can be used for many different reasons. One use of a spacer is to increase the insulating thickness between the component 6 and the conductor foil 12. The need to increase the insulating thickness can be imposed, for example, by the requirements set by the electrical operation of the circuit module or the component 6. In that case, with the aid of the spacer 15 it is possible to set the properties of the insulation between the component 6 and the conductor foil 12 as desired. The properties selected can be, for example, a desired specific resistance and spark-over resistance, which can be influenced by the selection of the material of the spacer 15 and the adhesive 5. The spacer can also be used to prevent a short-circuit between the component and the conductor foil 12. Such a use will come into question especially in embodiments in which the surface of the component 6 is pressed very close to the conductor foil, when a risk arises of unintended electrical contacts being formed between the conductor structures on the surface of the component and the conductor foil. A spacer can also be used to weaken the capacitive connection between the internal circuit elements of the component 6 and conductors 22 running next to the location of the component 6.

In addition to, or instead of a spacer 15, it is possible to use for the same purpose an insulator layer 13 entirely covering the surface of the conductor foil 12, as described in connection with FIG. 1.

In the examples of FIGS. 10-16, a spacer 15 is used in connection with a bumpless component 6, but the contact terminals of a component 16 with bumps must be made to extend closer to the surface of the conductor foil 12, so that a sufficient insulating gap can be ensured between the opposite surface of the component 16 and the conductor foil 14. In the embodiment, spacers 15 selected component-specifically can be placed in the circuit module, in order to optimize the electrical and/or mechanical properties of the circuit-board module. The same module can thus also contain different kinds of spacers 15 and thus spacers 15 can also be used in series production, in order to make components 6, 16 coming from different sources and with different properties to each other compatible with the circuit-board manufacturing process being used. One example of a mechanical property requiring optimization is the thickness of the insulator layer 1 (and at the same time of the entire module), which can be reduced with the aid of suitable selected spacers 15, which can be seen, for example, in FIG. 12.

Figure 12:
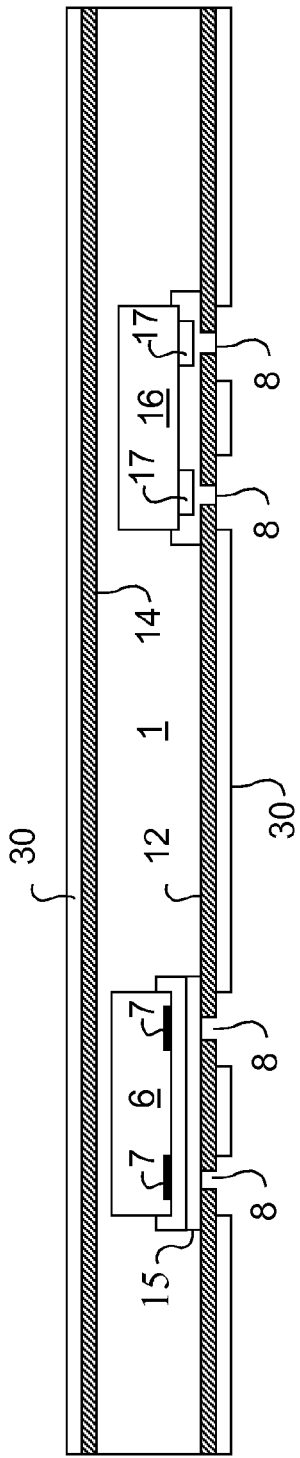

According to FIG. 11, manufacture is continued by spreading adhesive layers 5 on the surfaces of the conductor foil 12 and the spacer 15 in the connection areas of the components. The components 6 and 16 are aligned relative to the contact openings 8 and glued in place. After that, in the example of FIG. 11, insulator sheets 10, 11 and a conductor foil 14 are laminated on top of the conductor foil 12. Next, photo-resist layers 30, which are patterned in such a way that openings larger than the contact openings 8 are created at the positions of the contact openings 8, are spread on the surface of the conductor foils 12 and 14, or a coating is made electrophoretically on top of the entire conductor layer. This photo-resist layer 30 is used to limit the growth of an intermediate-layer material grown using a non-selective method to the contact holes and the immediate surroundings of the contact openings 8. Such a procedure can also be used in connection with the example described above, nor, on the other hand, is it essential in the examples of FIGS. 10-16. FIG. 12 shows the module after these stages. The contact terminals 7 of the component 6 are covered by both a spacer 15 and adhesive 5. There is adhesive on the surface of the contact bumps 17 of the component 16 and in the corresponding contact openings 8.

Figure 13:
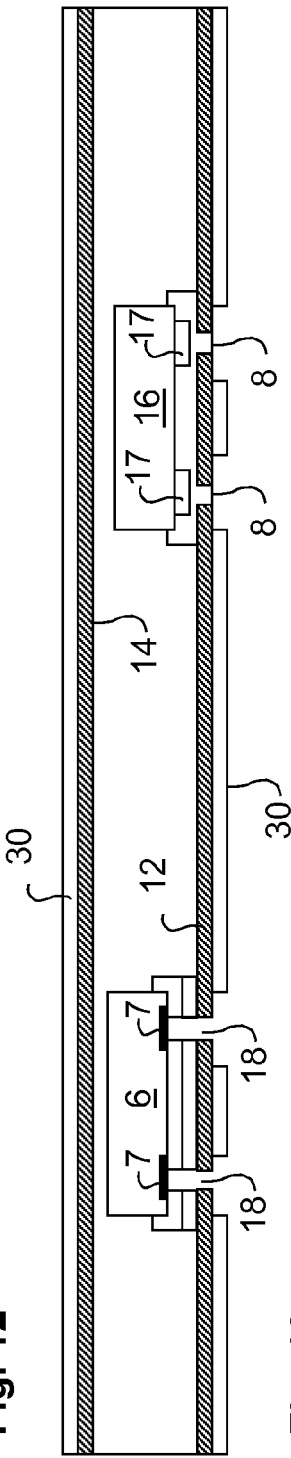

In the stage shown in FIG. 13, contact holes 18 are made at the positions of the contact openings 8 of the component 6. The contact holes are opened through the spacer 15 and the adhesive layer 5, as far as the contact surfaces of the contact terminals 7. In the embodiment of the figure, the opening of the contact holes 8 is implemented by the laser-ablation method, using a $CO_2$ laser, as described in connection with FIG. 4. In the embodiment of FIGS. 10-16, the important fact is that contact holes are not opened at this stage of the position of the contact terminals 17 of the second component 16.

Figure 14:
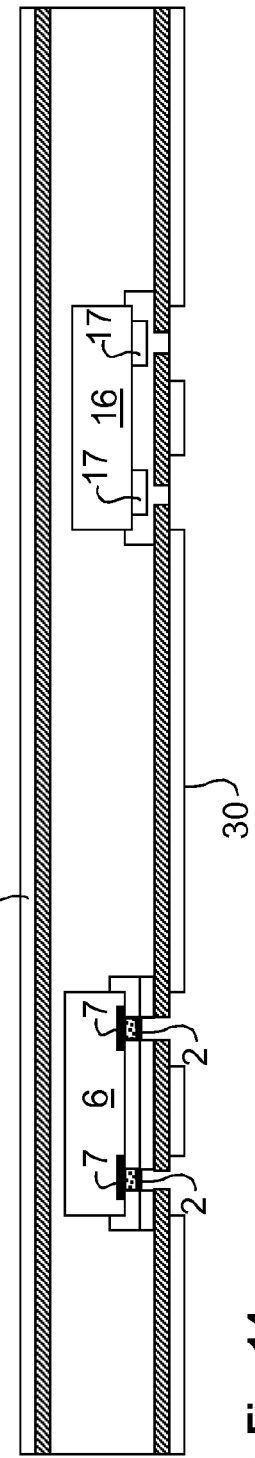

In the stage shown in FIG. 14, an intermediate layer 2, which is of a suitable material, is made in the contact holes 18 of the component 6. The conductor material of the intermediate layer 2 is selected on the basis of the material of the contact terminals 7 of the component 6 and manufactured using a suitable chemical conductor-material growing method. In the example of the figure, the material of the contact terminals 7 of the component is aluminium and the material of the intermediate layer 2 is mainly a metal alloy containing zinc. The principles described in connection with FIG. 5 above are applied to the growing of the intermediate layer. Unlike the example of FIG. 5, in the case of FIG. 14, it is, however, also possible to proceed in such a way that in this stage the intermediate layer 2 is grown with the aid of a selective method only on the surface of the contact terminals 7, i.e. on the bottom of the contact holes 18 and not on the edges of the contact holes 18. In this embodiment, the intermediate layer 2 coming on the edges of the contact holes 18 is grown later in connection with the growing of the intermediate layer relating to the contact bumps 17 of the component 16. The embodiment using a selective growing method has the advantage that the intermediate layer 2 does not grow on top of the adhesive layer covering the contact bumps 17 of the component 16.

Figure 15:
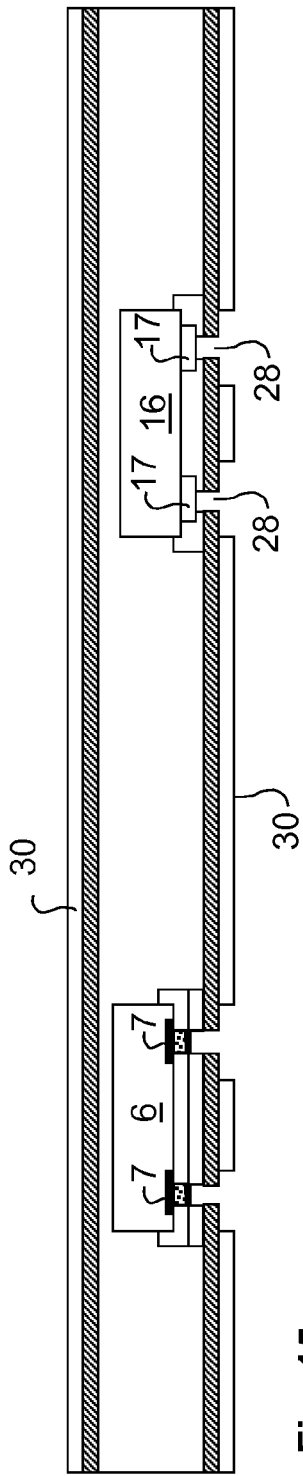
Figure 16:
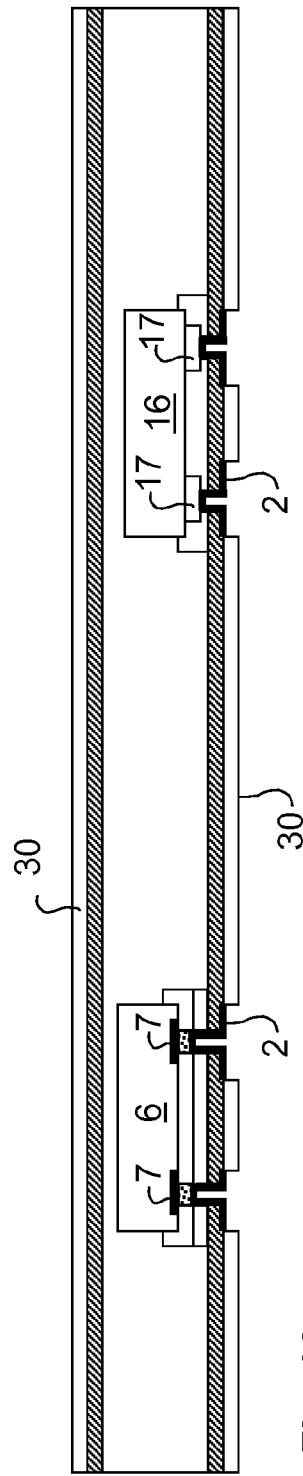

Manufacture is continued in the stage shown in FIG. 15 by manufacturing contact holes 28 at the positions of the contact openings 8 of the second component 16. After this, the module according to FIG. 16 is subjected to a suitable chemical conductor-material growing method. In the example of FIG. 15, the growing method in non-selective and the conductor material grows on all the free surfaces of the module and thus also in the contact holes 18 of component 6 and in the contact holes 28 of component 16. However, the photo-resist layer 30 protects the surfaces of the module, so that the intermediate layer 2 grows only in the contact holes 18 and 28 and in their surroundings. After this, the photo-resist and the conductor material that may have grown on its surface is removed. Such an embodiment using a photo-resist layer 30 can be useful, for example, when nickel or some other metal differing from copper is grown in the openings of the photo-resist layer, for example, using a non-selective method. The conductors 22 and 24 can then be manufactured to consist of solely a copper layer.

In other embodiments, suitably selected selective growing methods can also be used and the conductor material frown only on the surfaces of the contact bumps 17 of the component 16, correspondingly as described above in connection with FIG. 14. In any case, at this stage the intermediate layer 2 is grown at least on the surfaces of the contact bumps 17 of the component 16 and on the surfaces of the side walls of the contact holes 28 and, in addition, if desired also on the surface of the intermediate layer 2 connected to the contact terminals 17 of the component 6 and/or on the surfaces of the side walls of the contact holes 18 of the component 6.

If the example of FIGS. 10-16 were to be implemented without the use of a photo-resist 30, in the example of FIG. 16 the material of the surface of the contact bumps 17 of the component 16 could suitably also be copper and the material of intermediate layer 2 to be grown of the surface of the contact bumps 17 would then be copper manufactured suitably using a chemical growing method.

After the manufacture of the intermediate layer 2, in this embodiment manufacture can be continued, for example, in the manner stated in connection with the description of FIGS. 6-9, by manufacturing conductor patterns on the surface of the module and conductor cores for the contact elements located in the contact holes 18 and 28.

Figure 17:
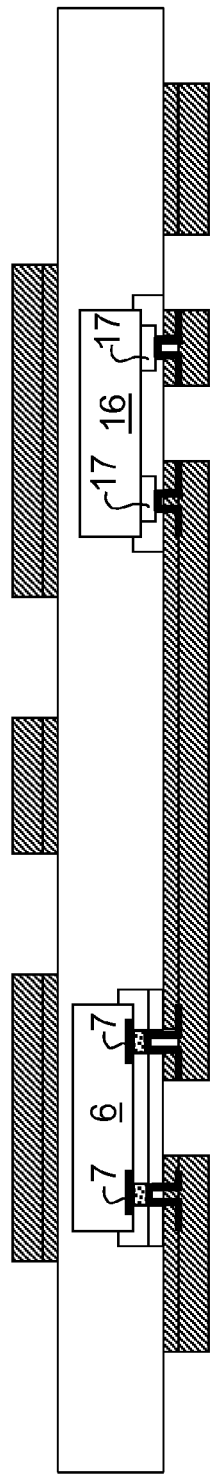
Figure 20:
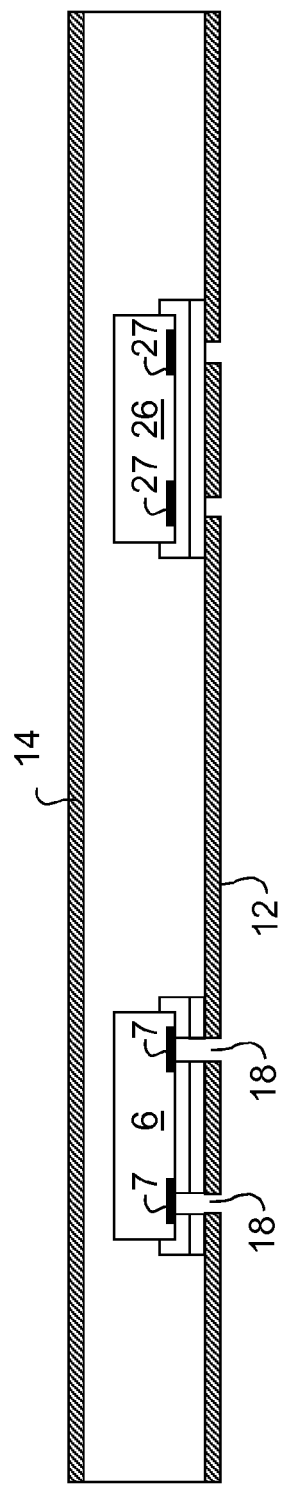

Another alternative is to coat copper on both conducting surfaces of the module, after the removal of the photo-resist layer 30. After this, the copper layers can be patterned to form conductors 22 and 24, when the structure shown in FIG. 17 will be obtained, in which the conductors 22 and 24 are formed of the first and second copper layers in the surroundings of the contact elements, as well as of an intermediate layer 2, which is of nickel for example, between them. Elsewhere, the conductors 22 and 24 are formed of a first and second copper layer, between which is the interface to be analysed. Once the structure of FIG. 17 has been manufactured, it is possible, if desired, to continue in some manner described in connection with any of the previous examples.

FIGS. 18-23 show a manufacturing method according to a third embodiment, which is a variation of the embodiment shown in FIGS. 10-16. From the intermediate stage of FIG. 23, manufacture can be continued, for example, in the manner shown in FIGS. 6-9. The technical features and parameters presented in connection with the description of FIGS. 1-5 and 10-16 can thus also be applied in the process stages shown in FIGS. 18-23, to that all the details and their advantages of the manufacturing process need not be unnecessarily repeated in the following embodiment. However, in the following the essential difference between the embodiments shown in FIGS. 10-16 and FIGS. 18-23 is presented.

In the embodiment of FIGS. 18-23, manufacture is commenced, as in the case of FIG. 10, from a conductor foil 12, in which contact openings 8 are made. After this, spacers 15 are attached to the surface of the conductor foil 12, to the future attachment points of the components 6 and 26. The spacers 15 of the components 6 and 26 can be mutually identical or selected component specifically, for example, in such a way that the spacer 15 of the component 6 is of a different material and/or thickness to the spacer 15 of the component 26.

According to FIG. 18, manufacture is continued by spreading adhesive layers 5 on the connection areas of the components and by laminating insulator sheets 10, 11 and a conductor foil 14 to the blank, exactly as described in connection with FIG. 11. FIG. 19 show the module after these stages.

In the stage shown in FIG. 19, contact holes 18 are made at the positions of the contact openings 8 of the component 6, as described in connection with FIG. 13. At this stage, contact holes are not yet opened at the positions of the contact terminals 27 of the component 26.

Figure 21:
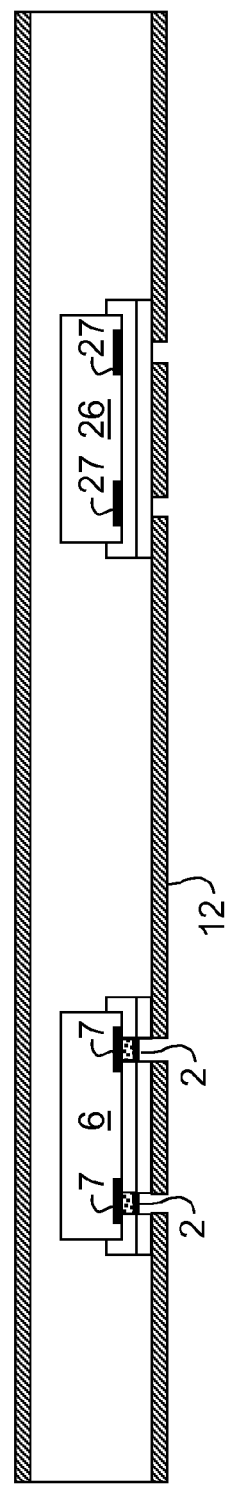

The stage shown in FIG. 21 corresponds completely to the method stage described in connection with FIG. 14. In this embodiment, an intermediate layer 2, which is of two layers, is manufactured in the contact holes 18 of the component 6. In the example of the figure, the material of the contact terminals 7 of the component is aluminium. The two-layer intermediate layer 2 of the example comprises first a grown layer containing zinc and after this a grown nickel-aluminium layer. The nickel-aluminium layer is grown by means of a chemical method and is used to seal the layer containing zinc.

Figure 22:
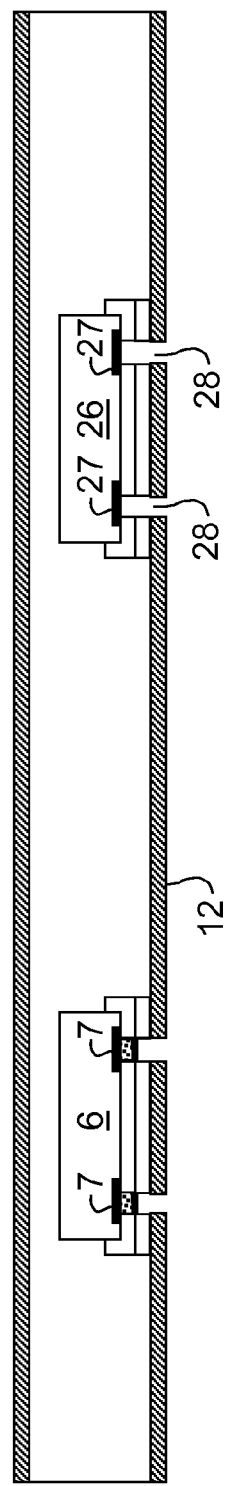

Manufacture is continued in the stage shown in FIG. 22, by making contact holes 28 at the positions of the contact openings 8 of the second component 26. After this, according to FIG. 23 the module is subjected to a suitable chemical conductor-material growing method. This stage corresponds to the method stage described in connection with FIG. 16. In the example of FIG. 23, the material of the surface of the contact terminals 27 of the component 26 is copper and the material of the intermediate layer 2 grown of the surface of the contact terminals is also copper.

FIG. 24, for its part, shows a modification of the embodiment of FIGS. 18-23, in which, after the stage shown by FIG. 22, a first intermediate layer is grown on top of the contact terminals 27 of the component 26, by means of a selective growing method and, after his, the growing of the intermediate layer 2 is continued using a non-selective method. In the example of FIG. 24, the material on the surface of the contact terminals 27 of the component 26 is gold and the material of the intermediate layer 2 grown on the surface of the contact terminals 27 is nickel.

In the embodiments of these FIGS. 18-24, after the manufacture of the intermediate layers 2 it is possible to continue, for example, by making conductor patterns on the surface of the module and conductor cores for the contact elements located in the contact holes 18 and 28, for example, by means of the manner stated in connection with the description of FIGS. 6-9.

Figure 25:
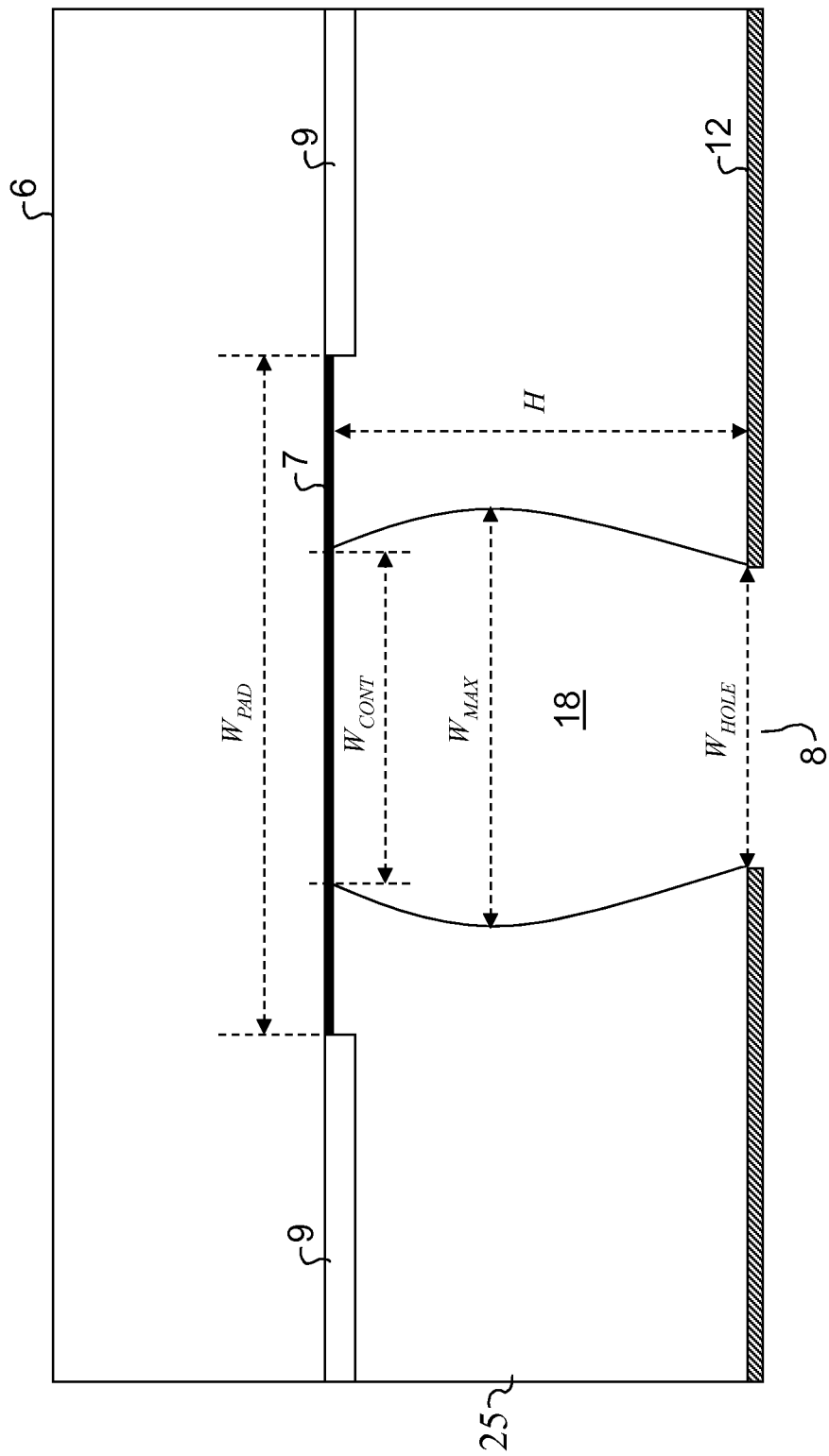
FIG. 25 shows one possible example of a contact hole and its dimensions made for a contact element of a circuit module.

FIG. 25 shows in greater detail the shape of the contact hole and correspondingly also the shape of the contact element to be manufactured in this opening. The example of FIG. 25 shows one possible shape, which can be achieved when using the embodiments described above. The shape can be affected with the aid of the shape of the contact openings 8 to be made in the conductor foil 12, the properties of the insulation between the conductor foil 12 and the component, and the operating parameters of the $CO_2$ laser. The contact hole of FIG. 25 is rotationally symmetrical and the cross-section shown in the figure is taken through the central axis of the contact hole, i.e. it shows the widest possible cross-section. In FIG. 25, the size and shape of the contact hole are determined with the aid of the following parameters:

greatest width $W_{MAX}$, from which the greatest cross-sectional area $A_{MAX}$ can be calculated, the width $W_{CONT}$ of the contact between the contact element and the contact surface 7 of the component 6, from which the contact surface-area $A_{CONT\ 1}$ between the contact element and the contact surface of the component can be calculated, and the width $W_{HOLE}$ of the contact opening, from which the contact surface-area $A_{CONT\ 2}$ between the contact element and the conductor of the conductor-pattern layer can be calculated.

The figure also shows the width $W_{PAD}$ of the contact surface of the component, from which the surface area $A_{PAD}$ of the contact surface can be calculated, if the shape of the contact surface is known. The contact surface 7 can be, for example, square in shape and, when $W_{PAD}$ represents the width of a side, the surface area of the contact surface is obtained as: $A_{PAD}=W_{PAD}\times W_{PAD}$. Of course, the surface areas can also be determined with the aid of surface-area measurement, which can be more practical if the surface area to be determined is of an irregular shape.

In the figure, the contact surface 7 is surrounded by a passivation layer 9 made on the surface of the component 6. In that case, the surface area $A_{PAD}$ refers precisely to the surface area free to form a contact, i.e. the surface area of the surface that is revealed in the opening made in the passivation layer 9. In addition, the figure shows the distance H of the distance between the conductor foil 12 and the contact surface 7, which corresponds to the depth of the contact hole and is thus the height of the contact element to be made in the contact hole. Because the contact hole is filled entirely with conductor material, the other dimensions too of the contact hole correspond to the dimensions of the contact element and the parameters $W_{MAX}$ and $W_{HOLE}$ can also be used to refer to the corresponding dimensions of the contact element.

The following presents some typical parameters in connection with the embodiments described above:

H=1-50 µm, usually 5-30 µm;

$W_{PAD}$=20-1000 µm, usually 50-200 µm, and most usually about 100 µm; and $W_{HOLE}$=5-500 µm, usually 20-75 µm, and most usually about 30-50 µm.

In addition, generally $W_{HOLE} \geq H$, which represents the reliable filling of the contact hole. The contact hole 18 is intended to be manufactured in such a way that the side walls of the hole would be vertical. In other words, the goal is a contact hole, the width and shape of which remains constant over the whole distance H between the conductor foil 12 and the contact surface 7, i.e. the contact hole would have the shape of the contact opening 8 over all of this distance. A shape that narrows towards the contact surface 7 is also good. In practice, when using the laser process described above the contact hole can, however, become widening towards the contact surface 7, or first widening and then narrowing, so that the contact hole is widest somewhere between the conductor foil 12 and the contact surface 7. FIG. 25 shows a contact hole of this kind. Such a non-optimal shape is not problematic, provided the widening is not too great and the filling of the hole succeeds well.

Of the dimension values of the widths referred to above, the width $W_{PAD}$ of the contact surface 7 of the component is determined through the selection of the component. If necessary, $W_{PAD}$ can be measured separately from each straight line that runs through the centre point of the contact surface 7. This definition may be required when examining the dimension values referred to above and their ratios, if the shape of the contact surface 7 or of the contact opening 8 is irregular. In the most usual cases, the contact surface is, however, square, in which case the width of the side of the square can generally be used as the width $W_{PAD}$ of the contact surface 7.

The width $W_{HOLE}$ of the contact opening 8 is a parameter, which is selected when planning the manufacturing process. One parameter to be taken into account when selecting the width of the contact opening 8 is the width of the contact surface 7 of the component being used. The width of the contact opening 8 is selected in such a way that the contact hole to be made through the contact opening will meet the contact area 7 of the component over its entire cross-sectional area are the component end, and will not miss the contact area, for example, on the surface of the passivation layer. If the contact opening is circular in shape, with width $W_{HOLE}$ of the contact opening is the diameter measured through the centre point of the circle. If, on the other hand, the contact opening is irregular I shape, $W_{HOLE}$ can, if necessary, be measured separately along each straight line that runs through the centre point of the contact opening 8. In the case of an irregular shape, when comparing the width $W_{HOLE}$ of the contact opening with the width $W_{PAD}$ of the contact surface, the comparison can always be made separately for each pair of widths measured through parallel straight lines. If necessary, the widths $W_{HOLE}$ and $W_{PAD}$ can also be compared in a corresponding manner to the other parameters described.

The ratios of the parameters described above can also be applied in connection with the contact bumps 17, in which case the surface area and width of the contact area will be replaced by the surface area and width of the contact bump and the distance H will be measured to the surface of the contact bump.

The shape of the contact hole can be influenced with the air of the laser parameters, which are selected according to the hole parameters and the properties of the insulation to be removed. The manufacturing result is, of course, also affected by the laser device being used. The suitability of the selected parameters for the process is indeed examined with the aid of a pilot manufacturing batch and, if necessary, the parameters are altered so that the desired result will be achieved.

In general, it is sensible in the manufacturing method to try to achieve a contact-hole shape, in which $W_{CONT}$=0.5-1.5 times $W_{HOLE}$, preferably 0.7-1.2 times $W_{HOLE}$, and most preferably 0.8-1.0 times $W_{HOLE}$, however, in such a way that $W_{CONT}<W_{PAD}$; and $W_{MAX}$=at most 100 µm, preferably at most 30µ, and most preferably at most 10 µm larger than whichever of the parameters $W_{HOLE}$ and $W_{CONT}$ is greater. Presented relatively, the objective would be for $W_{MAX}$=at most 40%, preferably at most 20%, and most preferably at most 10% greater than whichever of the parameters $W_{HOLE}$ and $W_{CONT}$ is greater.

In the most optimal shape of a contact element, $W_{MAX}$ is essentially as large as $W_{HOLE}$ and, in addition, $W_{CONT}$ is 0-20% smaller than $W_{MAX}$.

In the most typical embodiments, the contact surface 7 has a square shape and the contact opening 8 is circular in shape. In that case, $A_{CONT\ 1}$ is typically 10-75% of the surface area $A_{PAD}$. $A_{CONT\ 1}$ and $A_{CONT\ 2}$ are typically mutually approximately of equal size, for example, with an accuracy of ±20%.

Figure 26:
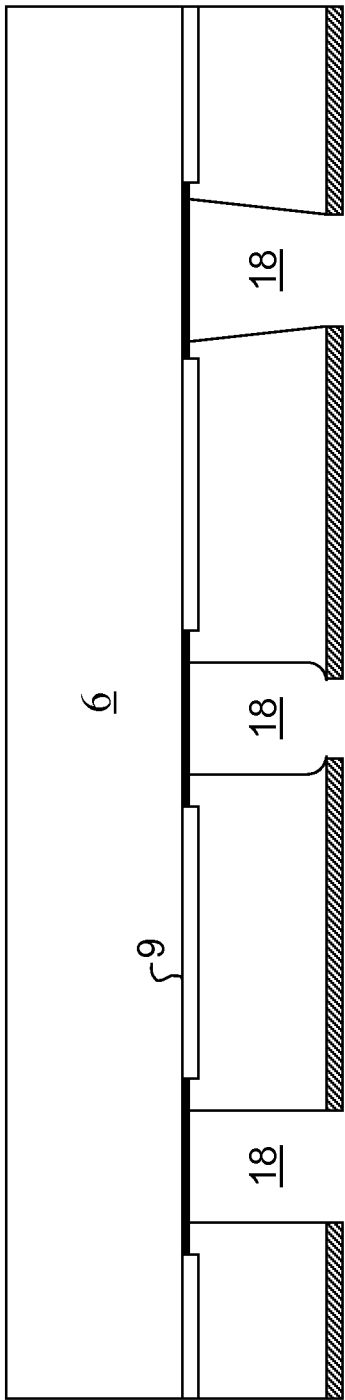
FIG. 26 shows examples of possible contact holes.
Figure 27:
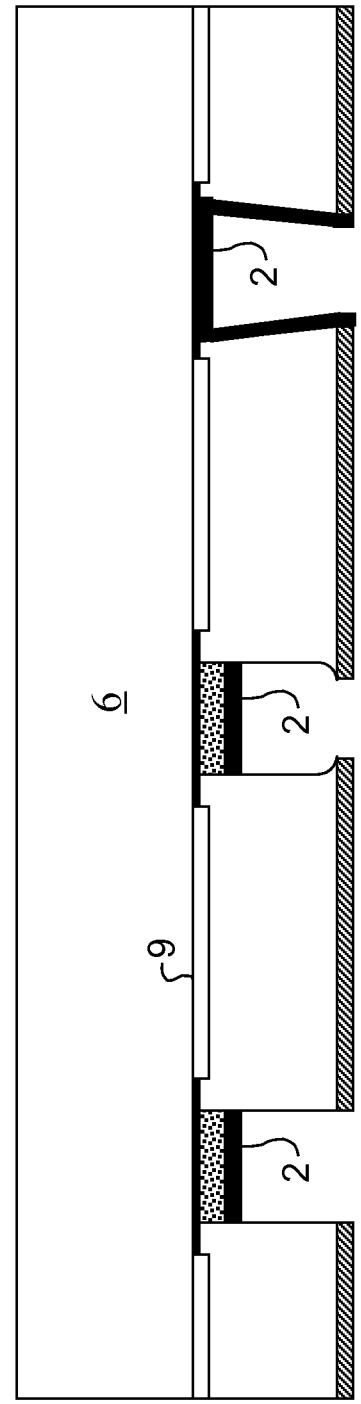
FIG. 27 shows some embodiments of intermediate layers manufactured in the contact hole of FIG. 26.

FIG. 26 shows examples of other possible shapes of the contact holes 18. FIG. 27, for its part, shows examples of intermediate layers 2 manufactured in such contact holes. In the examples of FIGS. 26 and 27, the component to be attached is bumpless. As can be seen from FIG. 27, the intermediate layers 2 do not extend at all on top of the passivation layer 9 of the component, but instead are in contact only with the contact surface 7 of the component. With the aid of this feature, it is possible to see even from the finished electronic module whether the component embedded in the electronic module has bumps or is bumpless. The bumps grown on the contact surface 7 of the component in the bump-creation processes always fill the entire contact surface 7 and always also spread slightly on top of the passivation layer 9. If, on the other hand, bumpless components are used in the embodiments described above, the intermediate layer 2 and the contact element grow only into the contact hole 18, when in the finished electronic module the intermediate layer 2 will not extend on top of the component's passivation layer 9 and part of the contact surface 7 of the component will always remain free of the intermediate layer 2 (the edges of the contact surface 7) when the alignment and manufacture of the contact hole 8 have succeeded. Also in a possible contact-hole 18 alignment-error situation, in which the contact opening 8 is not completely aligned with the contact surface 7, at least part of the edge areas of the contact surface 7 and of the passivation layer surrounding the edge area will be free of the intermediate layer 2.

If a bumpless component is manufactured by a semiconductor process using copper conductors, the contact area 7 is copper. In that case, the intermediate layer can be manufactured directly from chemically grown copper, which forms a conductor surfacing also on the side walls of the contact hole 18. After this, the contact holes 18 can be filled and the thickness of the conductor layer increased using an electrochemical copper-growing method.

At the moment of writing of the present application, the most commonly used conductor material in semiconductor processes is, however, aluminium. Thus, the most common material of the contact area 7 of bumpless components too is aluminium and it is preferable to use an intermediate layer, with one or more layers manufactured from different materials, between the aluminium contact area and the copper conductors of the electronics module. In the following, reference is made to a few possible intermediate-layer constructions:

Intermediate-Layer Construction 1

First of all, a layer containing zinc is grown on the surface of the aluminium contact area 7. The layer containing zinc manufactured by a zincate process does not grow on the polymer surfaces of the side walls of the contact hole 18. A layer of nickel, which does not grow at all or only poorly on a polymer surface, is grown by a chemical method on the surface of the layer containing zinc. A layer of copper is grown by a chemical method on the surface of the nickel. The copper grown by a chemical growing method can be made to grow reliably also on top of polymer, thus making the side walls of the contact holes 18 conductive for later electrochemical growing.

Intermediate-Layer Construction 2

First of all, a layer containing zinc is grown on the surface of the aluminium contact area 7. The layer containing zinc manufactured by a zincate process does not grow on the polymer surfaces of the contact hole 18. A layer of copper is grown by a chemical method on the surface of the layer containing zinc. The copper grown by a chemical growing method can be made to grow reliably also on top of polymer, thus making the side walls of the contact holes 18 conductive for later electrochemical growing.

Intermediate-Layer Construction 3

First of all, a layer containing zinc is grown on the surface of the aluminium contact area 7. The layer containing zinc manufactured by a zincate process does not grow on the polymer surfaces of the contact hole 18. A layer of nickel-aluminium, which does not grow on a polymer surface, is grown by a chemical method on the surface of the layer containing zinc. A layer of copper is grown by a chemical method on the surface of the nickel-aluminium. The copper grown by a chemical growing method can be made to grow reliably also on top of polymer, thus making the side walls of the contact holes 18 conductive for later electrochemical growing.

Intermediate-Layer Construction 4

First of all, a layer containing zinc is grown on the surface of the aluminium contact area 7. A layer of nickel-aluminium is grown by a chemical method on the surface of the layer containing zinc. A layer of nickel is grown by a chemical method on the surface of the nickel-aluminium and a layer of copper is grown by a chemical method on the surface of the nickel.

Intermediate-Layer Construction 5

First of all, a layer containing zinc is grown on the surface of the aluminium contact layer 7. A layer of nickel is grown by a chemical method on the surface of the layer containing zinc.

Intermediate-Layer Construction 6

A layer of nickel is grown by a chemical method on the surface of the aluminium contact area 7, which grown nickel layer alone forms the intermediate layer 2.

Intermediate-Layer Construction 7

A layer of nickel is grown by a chemical method on the surface of the aluminium contact area 7, and a layer of copper is grown by a chemical method on the surface of the nickel.

In the above examples of intermediate-layer constructions, the layer containing zinc contains, for example, about 80% zinc, about 16% copper, about 2-3% nickel, and about 2-3% iron. This is only one possible example of alloy ratios suitable for the application, so that the alloy ratios can, of course, vary according to the applications. In the above examples of intermediate constructions, the thickness of the layer containing zinc is less than 1 μm, usually as a single layer about 0.1 μm and as several layers, for example 0.3-0.4 μm. At its thinnest, the layer containing zinc can be about 5-10 nm after manufacture. When growing a layer containing nickel or nickel-aluminium on top of the layer containing zinc, at least some of the zinc atoms dissolve and are replaced with nickel atoms. In the finished circuit module, it can be possible for the layer containing zinc to be observable as mainly a concentration profile of zinc in the interface between the aluminium and the material of the next layer. The layer containing zinc need not necessarily be precisely limited in the final product, because the zinc can diffuse to the adjacent material layers, particularly in stages of the manufacturing process using higher temperatures.

In one preferred embodiment, the layer containing zinc is grown by a double zincate process. With a single zincate process, the zinc forms a non-uniform and uneven surface on top of the aluminium. The adhesion of a nickel layer grown on top of such a surface is weaker and is less suitable for use with small micro-via openings. The quality of the grown zinc surface can be significantly improved by using a double zincate process. Typically, in such a process, after the first zincate treatment, the layer containing zinc is stripped using nitric acid ($HNO_3$), after which a second layer containing zinc is coated. By means of the double zincate process, a tight and uniform layer containing zinc is obtained on the surface of the component's aluminium junction interface.

The thickness of the nickel-aluminium layer, for its part, can be, for example, 0.2-2 μm. The thickness of the nickel layer, on the other hand, can be, for example 0.5-20 μm, typically 2-10 μm. The layer thicknesses too are only examples of the possible layer thicknesses and other layer thicknesses can also be used.

In the embodiments, the electrochemically grown copper layer can have a thickness of, for example, 5-30 µm, typically 10-20 µm. The copper layer grown by a chemical growing method, for its part, is generally manufactured to be clearly thinner, and its thickness in the embodiments is, for example, 0.1-2 µm, typically 200-800 nm.

In the manufacturing methods described above, it is, of course, also possible to use intermediate-layer constructions and materials, for example tin, other than those referred to above. It is also possible to grown a nickel layer directly on the surface of the aluminium, for example, by alkali etching and flushing the surface after this with propan-2-ol and immediately after this coating with propan-2-ol at boiling point in a warm chemical nickel bath. In addition, the surface of the layer containing zinc could also be coated with chromium and gold on the surface of the nickel.

Figure 28:
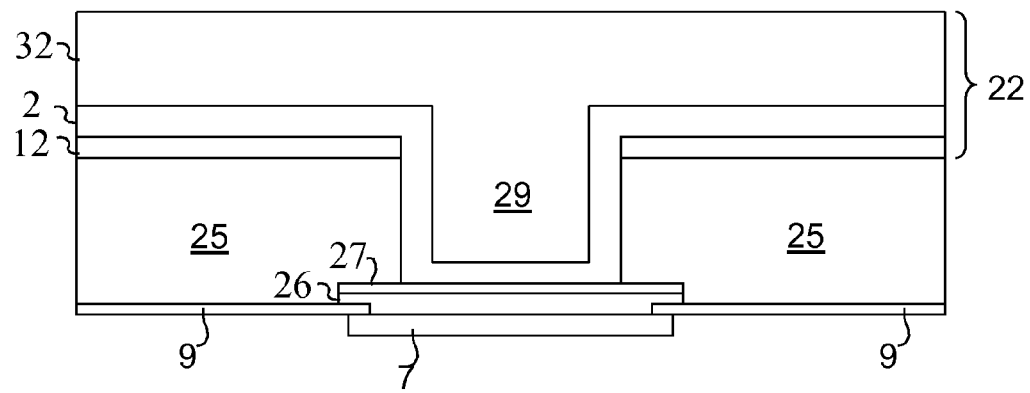
FIG. 28 shows one contact-element structure.
Figure 29:
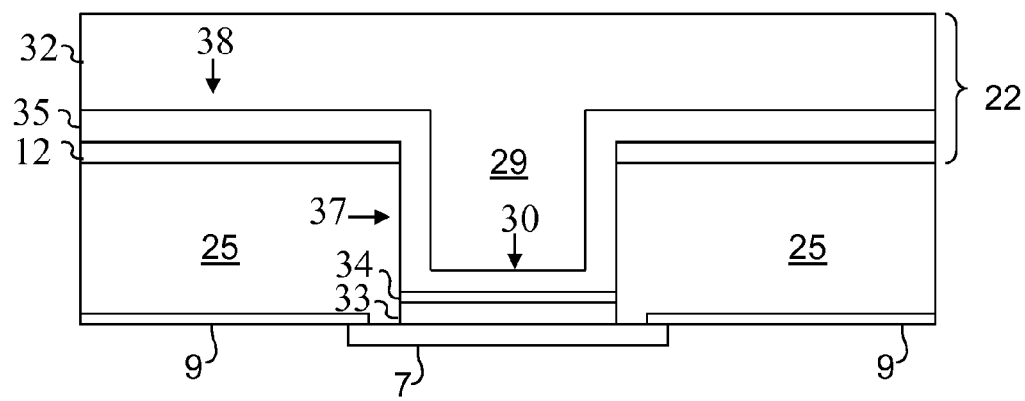
FIG. 29 shows a second contact-element structure.

FIG. 28 shows yet another possible contact structure, in which it is possible to use components, the contact area of which is pre-equipped with base-metallurgical layers, though bumps as such are not made. FIG. 29 shows one possible corresponding contact structure, implemented with a bumpless component.

FIG. 28 shows a passivation layer 9 on the surface of the component, in which there is an opening at the position of the contact area 7 of the component. There is a polymer layer 25 of the surface of the passivation layer 9. The polymer layer 25 can consist of one or more polymer layers. The material of the polymer layer 25 can contain, for example, an insulator layer 13 depicted in connection with FIG. 1, adhesive 5 depicted in connection with FIG. 2, and/or a spacer depicted in connection with FIG. 11. The base metallurgy, which in this case comprises two layers, is made on the surface of the contact area 7 of the component. The first base-metallurgy layer 26 is a layer of, for example, chromium (Cr) or titanium-wolfram (TiW) manufactured by sputtering. The second base-metallurgy layer 27 is a layer of, for example, nickel (Ni), copper (Cu), or gold (Au), manufactured by sputtering. The actual bump comprises further a gold or copper layer, for example, grown chemically or electrochemically, on the surface of the second base-metallurgy layer 27.

In the example of FIG. 28, the component is attached by a polymer layer 25 to a conductor foil 12, in which contact openings 8 have been made as depicted in the methods described above. Contact holes 18 or 28, in which a contact element is made in contact with the second base-metallurgy layer 27, are made through the contact openings 8. The contact element is made in such a way that first of all an intermediate layer 2 is made using one or more chemical growing methods, in a corresponding manner to that depicted in the methods described above. In the example of FIG. 28, the intermediate layer 2 is of copper grown using a chemical growing method. On top of this intermediate layer a layer 32 of copper is grown using an electrochemical growing method. The electrochemically grown copper also forms the conductor core 29 of the contact element. It can be seen from FIG. 28 that the conductor foil 12, the intermediate layer 2, and the copper layer 32 together form the material of the conductor 22. In the example, the conductor foil 12, the intermediate layer 2, and the copper layer 32 are all of copper, but the layers and the interfaces between them, can, however, also be detected by analysing the finished structure.

Like FIG. 28, FIG. 29 shows a passivation layer 9, in which there is an openings at the position of the contact area 7 of the component, on the surface of the component. On the surface of the passivation layer 9 is a polymer layer 25, which corresponds to that shown in connection with FIG. 28. In the example of FIG. 29, the surface of the contact area 7 of the component has been a uncoated component when it was brought to the circuit-module manufacturing process. In such a component, the outer surface of the contact area 7, i.e. the contact surface, is thus typically formed already at the semiconductor factory. In the example of FIG. 29, the material of the contact area 7 is aluminium.

In the example of FIG. 29, the component is attached by a polymer layer 25 to the conductor foil 12, in which contact openings 8 are made in the manner depicted in the methods described above. Contact holes 18 or 28, in which a contact element is made in contact with the contact area 7, have been made through the contact openings 8. The contact element is made in such a way that first of all an intermediate layer 2 is made using one or more chemical growing methods, in a corresponding manner to that described above. In the example of FIG. 29, the intermediate layer 2 is made in several parts and comprises several layers. In FIG. 28, the intermediate layer is, in addition, to facilitate the description, divided into three parts, a base part 36, a wall part 37, and a conductor part 38. The base part 36 is the part that grows on the surface of the contact terminal 7, 17 to the bottom of the contact hole 18, 28, the wall part 37 is the part that grows on the surfaces of the side walls of the contact hole 18, 28, and the conductor part 38 is the part that grows to form part of the conductor 22 being manufactured.

The intermediate layer 2 of FIG. 29 comprises a first intermediate layer 33, a second intermediate layer 34, and a third intermediate layer 35. The first intermediate layer 33 can be made, for example, by using a chemical growing method to grow a layer containing zinc. In the example of FIG. 29, the conductor foil 12 is of copper, so that when using a zincate process the first intermediate layer 33 grows only on the base part 36 of the intermediate layer 2. From this, manufacture can be continued, for example, by using a chemical nickel-growing method to make the second intermediate layer 34. The nickel grows on both the base part 36 and the conductor part 38 of the intermediate layer and, when using some growing methods, on the wall part 37 too on the surface of the polymer 25. The third intermediate layer 35 is made from copper on top of the second intermediate layer 34 using a chemical growing method, so that the copper grows on the base part 36, the wall part 37, and the conductor part 38. A layer 32 of copper is grown on top of the third intermediate layer using an electrochemical growing method, which also forms the conductor core 29 of the contact element.

In the case of FIG. 29, it should be noted that, in the finished circuit module, the layers 33 and 34 do not have precise boundaries as shown in the figure, but instead the layers can appear as overlapping or mixed, for example, from the effect of diffusion. For example, in the case of the first intermediate layer 33 containing zinc, the zinc can be located as a concentration profile in the interface between the aluminium and nickel 34 and partly inside the aluminium 7 and the nickel layer 34.

In the contact structure of FIG. 29, other material combinations can also be used. For example, suitably selected intermediate-layer structures from the intermediate-layer constructions 1-7 described above can be used to form the contact structure depicted by FIG. 29 and also the contact structures depicted by FIGS. 30-33. In addition, the contact structure of FIG. 29 can also be manufactured with the aid of the materials shown by FIG. 28, in such a way that the first intermediate layer 33 and the second intermediate layer 34 are made by sputtering. In that case, the sputtered intermediate layers 33 and 34 will grow to the base part 36 and the conductor part 38, but not to any substantial extent to the wall part 37, provided the contact hole 18, 28 does not widen towards the contact opening 8. One possibility is to use a first intermediate layer 33 containing zinc and on the surface of this either directly a third intermediate layer 35 made from nickel by a chemical growing method, or a construction, in which a second intermediate layer 34 made from nickel-aluminium is used between the layers 33 and 35. In such an embodiment, there is no need at all of chemical copper growing, as the nickel forms a vertical contact along the side wall of the contact hole.

Figure 30:
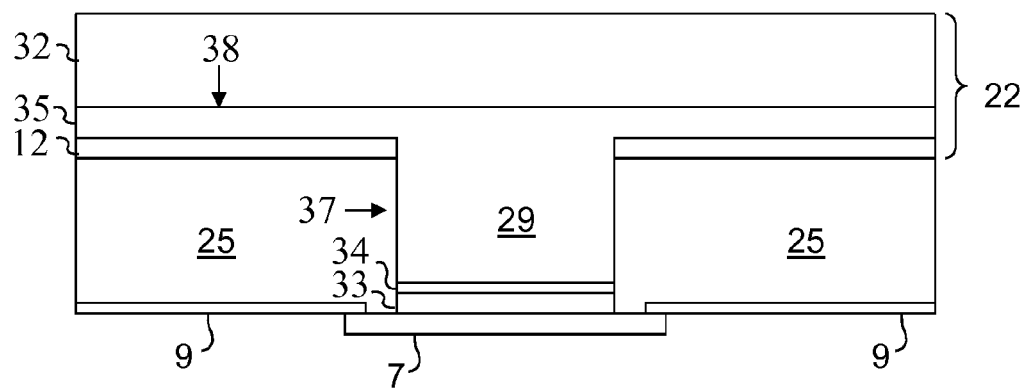
FIG. 30 shows a third contact-element structure.

FIG. 30 shows yet another contact-element structure. In the structure of FIG. 30, the intermediate layer 2 comprises a first intermediate layer 33, a second intermediate layer 34, and a third intermediate layer 35. The first intermediate layer 33 can be made, for example, by using a chemical growing method to grow a layer containing zinc. The second intermediate layer 34 is of nickel-aluminium and the third intermediate layer 35 is of nickel grown by a chemical growing method. This, in the structure of FIG. 30, the contact hole is filled with nickel, i.e. the conductor core 29 of the contact element is nickel. Otherwise, the technical features described in connection with FIGS. 28 and 29 apply in the case of the structure of FIG. 30.

Figure 31:
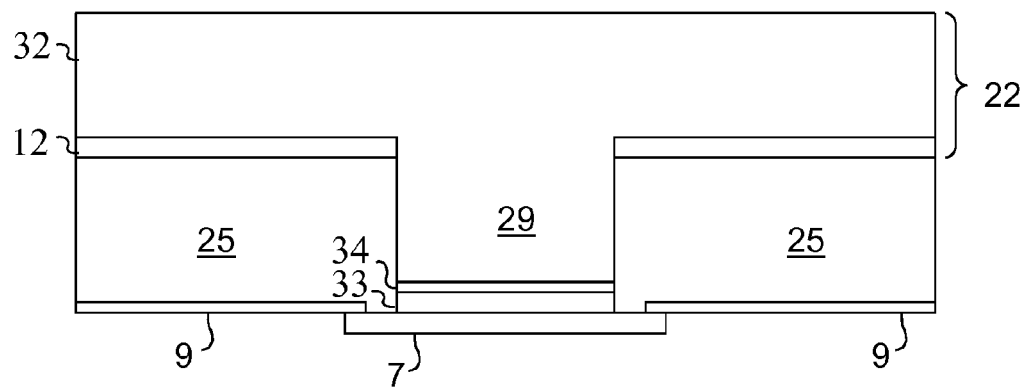
FIG. 31 shows a fourth contact-element structure.

FIG. 31 shows yet another contact-element structure. In the structure of FIG. 31, the intermediate layer 2 comprises a first intermediate layer 33 and a second intermediate layer 34. The first intermediate layer 33 can be manufactured, for example, by using a chemical growing method to grow a layer containing zinc. The second intermediate layer 34 is of copper grown by a chemical growing method, or alternatively of nickel grown by a selective chemical growing method. Alternatively, the structure of FIG. 31 can also be made in such a way that the first and second intermediate layers 33 and 34 are replaced with a single layer of chemically grown nickel. The conductor core 29 is typically copper and the conductor 22 comprises a first and second copper layer 12 and 32. Otherwise the technical features described in connection with FIGS. 28 and 29 apply in the case of the structure of FIG. 31.

Figure 32:
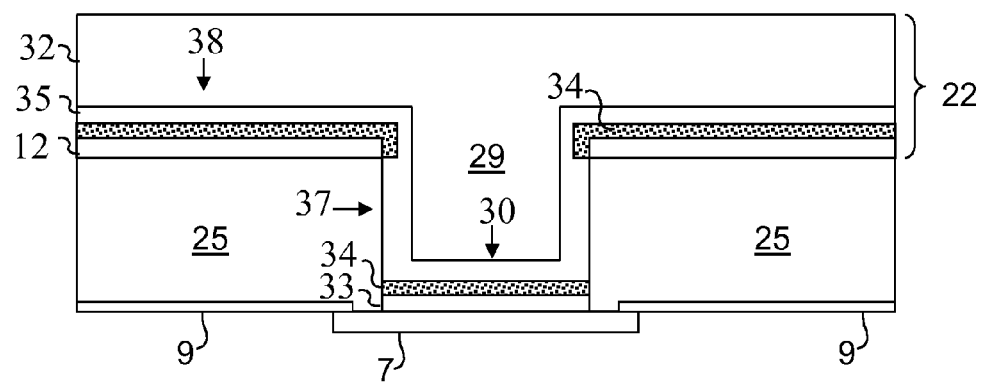
FIG. 32 shows a fifth contact-element structure.

FIG. 32 shows yet another contact-element structure. In the structure of FIG. 32, the intermediate layer 2 comprises a first intermediate layer 33, a second intermediate layer 34, and a third intermediate layer 35. The first intermediate layer 33 can be made, for example, by using a chemical growing method to grow a layer containing zinc. The second intermediate layer 34 is of nickel grown by a chemical growing method. In the method, the growing method is selective, in such a way that the nickel grows on top of conductive material. The third intermediate layer 35 is of copper grown by a chemical growing method. Alternatively, the structure of FIG. 32 can also be made in such a way that the first intermediate layer 33 is omitted. The conductor core 29 is typically of copper. Otherwise the technical features described in connection with FIGS. 28 and 29 apply in the case of the structure of FIG. 32.

Figure 33:
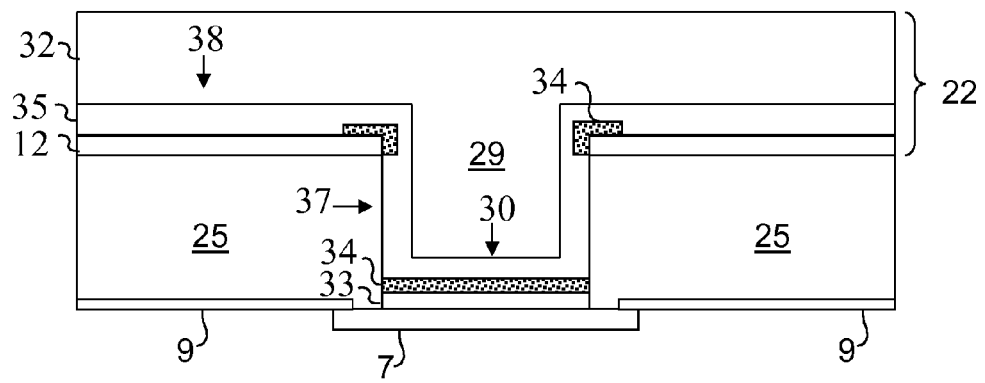
FIG. 33 shows a sixth contact-element structure.

FIG. 33 shows yet another contact-element structure. The method described in connection with FIGS. 10-17, for example, in which a photo-resist layer 30 is used, can be used for making the structure of FIG. 32. In the structure of FIG. 33, the intermediate layer 2 comprises a first intermediate layer 33, a second intermediate layer 34, and a third intermediate layer 35. The first intermediate layer 33 can be made, for example, by using a chemical growing method to grow a layer containing zinc. The second intermediate layer 34 is of nickel grown by a chemical growing method. In the method of the example, the growing method is selective, in such a way that the nickel grows only on top of conductive material. The third intermediate layer 35 is of copper grown by a chemical growing method. Alternatively, the structure of FIG. 33 can also be made in such a way that the first intermediate layer 33 is omitted. The conductor core 29 is typically of copper. Otherwise the technical features described in connection with FIGS. 28 and 29 apply in the case of the structure of FIG. 33.

Thus, in the embodiments a method is presented for the manufacture of a circuit module, in which method
a conductor foil 12 is taken,
a component 6, which comprises contact areas 7, the material of which contains a first metal, is taken,
the component 6 is attached to a conductor foil 12 by means of a polymer layer 25,
an insulator layer 1 is manufactured around the component 6 attached to the conductor foil 12,
contact holes 18, 28 are made in the polymer layer 25 at the positions of the contact areas 7, in such a way that the contact surface area $A_{CONY1}$ between each contact hole 18, 28 and the corresponding contact area 7 is less that the surface area $A_{PAD}$ of the contact area 7, and
an intermediate layer 2, which contains at least a third metal, is grown at least on the surface of the contact areas 7 in the contact holes 18, 28, and
a layer 32 of a second metal is grown, which layer 32 is in contact with the surface of the intermediate layer 2 and extends along the conductors 22 being made, and
conductors 22 are formed by patterning the conductor foil 12, and, if necessary, also the intermediate layer 2 on the surface of the conductor foil 12 and/or the layer 32 of a second metal.

In a typical embodiment, the contact holes 8 are made in the conductor foil 12 before attaching the component, so that the component is thus attached to a conductor foil 12 equipped with contact openings. In the commonest form of this type of embodiment, the contact openings do not extend to the surfaces of the contact areas 7, so that after the attaching of the component 6 contact holes 18, 28 are further opened through the contact openings 8.

In one embodiment, the first metal is aluminium, the second metal is copper, and the third metal is zinc. In such an embodiment, the intermediate layer 2 can, of course, in addition to zinc, also contain other metals or metal alloys, as stated above.

In a second embodiment, the first metal is aluminium, the second metal is copper, and the third metal is nickel. In such an embodiment, the intermediate layer 2 can, of course, in addition to nickel, also contain other metals or metal alloys, as stated above.

In a third embodiment, the first metal is gold, the second metal is copper, and the third metal is nickel. In such an embodiment, the intermediate layer 2 can, of course, in addition to zinc, also contain other metals or metal alloys, as stated above.

In the commonest embodiment, the material of the contact areas 7 is mainly aluminium and the material of the conductors is copper and between them is one of the intermediate-layer constructions 1-7 described above.

When making the intermediate-layer construction, at least one chemical growing method is typically used.

The embodiments depict a circuit module, which comprises
an insulator layer 1,
inside the insulator layer 1, at least one component 6, which comprises contact areas 7, the material of which contains a first metal,
on the surface of the insulator layer 1, conductors 22, which comprise at least a first layer 12 and a second layer 32, in such a way that at least the second layer 32 contains a second metal, and
contact elements for forming electrical contacts between the contact areas 7 and the conductors 22, which contact elements comprise an intermediate layer 2, which contains a third metal, on the surface of the material of the contact area 7, in which the first, second, and third metals are different metals, and the contact surface area $A_{COT\ 1}$ between the intermediate layer 2 and the contact area 7 is less than the surface area $A_{PAD}$ of the contact area.

In one embodiment, the first metal is aluminium, the second metal is copper, and the third metal is zinc. In such an embodiment, the intermediate layer 2 can, of course, in addition to zinc, also contain other metals or metal alloys, as stated above.

In a second embodiment, the first metal is aluminium, the second metal is copper, and the third metal is nickel. In such an embodiment, the intermediate layer 2 can, of course, in addition to nickel, also contain other metals or metal alloys, as stated above.

In a third embodiment, the first metal is gold, the second metal is copper, and the third metal is nickel. In such an embodiment, the intermediate layer 2 can, of course, in addition to nickel, also contain other metals or metal alloys, as stated above.

In the commonest embodiment, the material of the contact areas 7 is mainly aluminium and the material of the conductors is copper and between them is one of the intermediate-layer constructions 1-7 described above.

In a typical embodiment, the contact elements comprise a copper core 29 made using an electrochemical growing method, which, in the direction of the side walls and the component 6 is bounded by the intermediate layer 2 and in the direction of the conductor 22 connects continuously, i.e. without an interface to the material of the second layer 32 of the conductor 22. In order words, the material of the copper core 29 of the contact element and of the second layer 32 of the conductor 22 is manufactured in the same process, so that the parts are attached permanently to each other and there is no interface between them. Between the first layer 12 and second layer 22 of the conductor, on the other hand, there is typically an interface, or a corresponding transition zone, which can be detected, for example, by analysing the crystalline structure or impurity concentration of the metal.

In one embodiment, the width $W_{CONT}$ of the contact surface between the contact element and the contact area 7 of the component is 0-20% less than the greatest width $W_{MAX}$ of the contact element in the same direction.

The contact elements usually fill entirely the contact holes 18, 28, i.e. the contact elements are not hollow, but are solidly of conductor material.

Usually, the aim in the embodiments is for the height H of the contact element to be less than, or equal to the greatest width $W_{MAX}$ of the contact element.

There are also embodiments of the circuit module, in which the insulator layer 1 includes at least one layer of fibre material 19, in which there is an opening in the fibre material 19 for the component 6, as well as a uniform polymer layer, which is attached to the fibre material 19 and to the components 6, 16.

The manufacturing processes described above and their sub-processes can be modified in many ways. For example, the use of an actual adhesive depicted above in attaching the component to the conductor foil 12 can be replaced with some other adhesion mechanism. On example that can be given is the use of an insulator layer 13 possessing an adhesion property on the surface of the conductor foil 12 (see FIG. 1 and the corresponding description). The components 6 are then pressed directly against the insulator layer 13, so that the components attach sufficiently in place in a manner correspondingly to that described in connection with the embodiment using adhesive.

Such an insulator layer 13 can contain, for example, a tape-like surfacing, or consist of a polymer or similar material that is shapeable at least in its surface part.

The method can also be implemented without the use of an adhesive 5 or an adhesion property. In that case, the components 6 can be attached in place, for example, mechanically or with the aid of a vacuum. The vacuum or similar temporary attachment can then be maintained until the component 6 is sufficiently secured in place with the aid of the insulator material 1.

The component 6 to be attached can be, for example, an integrated circuit, such as a memory chip, processor, or ASIC. The component to be attached can also be, for example, a MEMS, LED, or passive component. The component to be attached can be cased or uncased and its contact terminals can consists of contact areas 7, contact bumps 17, or similar. There can also be a conductor coating thinner than an actual contact bump on the surface of the contact areas of the component.

A different material of the insulator layer 1 from those in the examples described above can also be selected. The insulator layer 1 can be manufactured from a suitable polymer or from a material containing polymer. The material of manufacture of the insulator layer 1 can be, for example, in a liquid or pre-hardened form (such as prepreg). In the manufacture of the insulator layer 1 it is possible to use, for example, glass-fibre reinforced sheet, such as an FR4 or FR5-type sheet. Other examples of materials, which can be used in the manufacture of the insulator layer 1 are PI (polyimide), aramide, polytetrafluoroethylene, and Teflon®. Instead of, or as well as thermosetting plastics, thermoplastics too, for example some suitable LCP (liquid crystal polymer) material can be used in the manufacture of the insulator layer 1.

In addition, it is obvious to one skilled in the art that the features described above of the invention can be used as part of some larger totality, for example, in such a way that the electronics module is manufactured partly using some method according to the prior art and partly using the embodiments depicted here. It is also possible to manufacture additional circuit-board layers on the surface or surfaces of the electronic-module structures described above, or also to attach components, for example, by means of the surface-mounting technique.

One skilled in the art will also understand that, when reference is made in the present document to a specific material, for example, aluminium, nickel, or copper, the reference is to a material, which in terms of the application is substantially of the said material. The material referred to can thus, in addition to the said principal element contain, from the point of view of the application, insubstantial amounts of impurities and other elements. For example, an aluminium contact area is usually of a material that typically contains a minimum of 95% aluminium.

When, on the other hand, reference is made to a material containing some specific element, this means that the material contains an essentially large content of the said element. In addition, the material can contain substantial or insubstantial amounts of other elements. For example, the layer containing zinc will thus contain an amount of zinc that is of significance in terms of the contact properties between the aluminium and the next metal.

The examples given above depict some possible methods and structures, which the aid of which our invention can be exploited. However, our invention is not restricted to only the examples and embodiments described above, but instead the invention covers numerous other methods and structures, taking into account the full scope of the Claims and the equivalence interpretation.

The invention claimed is:

1. Circuit module, comprising
a first insulator layer having a first surface and a second surface;
at least one second insulator layer on the first surface;
at least one component inside the at least one second insulator layer, the at least one component comprising contact terminals containing a first metal,
conductors on the second surface of the first insulator layer, the conductors comprising at least a first layer and a second layer, in such a way that at least the second layer contains a second metal, and
contact elements between the contact terminals and the conductors for forming electrical contacts, the contact elements comprising an intermediate layer on the surface of the contact terminal, the intermediate layer containing a third metal, a contact surface area ($A_{CONT\ 1}$) between the intermediate layer and the contact terminal being less than a surface area ($A_{PAD}$) of the contact terminal.

2. The circuit module of claim 1, wherein the first metal is aluminium, the second metal is copper, and the third metal is at least one of the metals zinc and nickel.

3. The circuit module of claim 1, wherein the first metal is gold, the second metal is copper, and the third metal is nickel.

4. The circuit module of claim 1, wherein the intermediate layer comprises a layer containing zinc.

5. The circuit module of claim 1, wherein the intermediate layer comprises a layer containing copper.

6. The circuit module of claim 1, wherein the intermediate layer comprises at least one layer of nickel and/or of nickel and aluminium.

7. The circuit module of claim 1, wherein the intermediate layer extends along the side walls of the contact elements between the contact terminals and the conductors.

8. The circuit module of claim 1, wherein each contact element comprises a copper core, which connects continuously to the material of the second layer of the conductors.

9. The circuit module of claim 1, wherein the conductors comprise
a first layer of copper on the second surface of the first insulator layer, and
a second layer of copper on the surface of the first copper layer.

10. The circuit module of claim 1, wherein the conductors comprise
a first layer of copper on the second surface of the first insulator layer,
an intermediate layer on the surface of the first copper layer, and
a second layer of copper on the surface of the intermediate layer.

11. The circuit module of claim 10, wherein the intermediate layer between the first and second coppers layers comprises copper grown by a chemical growing method or nickel grown by a chemical growing method.

12. The circuit module of claim 1, wherein a width ($W_{CONT}$) of the contact surface between the contact element and the contact terminal of the component is 0-20% less than a greatest width ($W_{MAX}$) of the contact element in the same direction.

13. The circuit module of claim 1, wherein a height (H) of the contact element is less than, or equal to a greatest width ($W_{MAX}$) of the contact element.

14. The circuit module of claim 1, wherein the at least one second insulator layer contains at least one layer of fibre material and an opening in the fibre material for the at least one component.

15. The circuit module of claim 1, comprising a polymer layer between the first insulator layer and the at least one component and contact holes for the contact elements in the polymer layer.

16. The circuit module of claim 15, wherein the polymer layer comprises layer of a hardened adhesive.

17. Circuit module, comprising
a conductor layer comprising conductors, the conductors having a first surface and a second surface and at least two layers of metal between the first surface and the second surface;
a first insulator layer having a first surface and a second surface, the second surface of the first insulator layer covering the first surface of the conductors;
at least one second insulator layer on the first surface of the first insulator layer;
at least one component inside the at least one second insulator layer, the at least one component comprising contact terminals containing at least one layer of metal;
contact elements between at least some of the contact terminals and at least some of the conductors for forming electrical contacts, the contact elements comprising an intermediate layer on the surface of the contact terminal, the intermediate layer containing at least one layer of metal, a contact surface area ($A_{CONT\ 1}$) between the intermediate layer and the contact terminal being less than a surface area ($A_{PAD}$) of the contact terminal;
at least one layer of metal in the contact terminals containing a first metal;
at least one layer of metal in the conductors containing a second metal; and
the intermediate layer containing a third metal.

18. The circuit module of claim 17, comprising a layer of hardened adhesive between the first insulator layer and the at least one component.

19. Circuit module, comprising
a conductor layer comprising conductors, the conductors having a first surface and a second surface and at least two layers of metal between the first surface and the second surface;
a first insulator layer having a first surface and a second surface, the second surface of the first insulator layer entirely covering the first surface of the conductors;
at least one second insulator layer on the first surface of the first insulator layer;
at least one component inside the at least one second insulator layer, the at least one component comprising contact terminals containing at least one layer of metal; and
contact elements between at least some of the contact terminals and at least some of the conductors for forming electrical contacts, the contact elements comprising an intermediate layer on the surface of the contact terminal, the intermediate layer containing at least one layer of metal, a contact surface area ($A_{CONT\ 1}$) between the intermediate layer and the contact terminal being less than a surface area ($A_{PAD}$) of the contact terminal.

20. The circuit module of claim 19, comprising a layer of hardened adhesive between the first insulator layer and the at least one component.

* * * * *